(12) United States Patent
Lee et al.

(10) Patent No.: US 10,804,163 B2
(45) Date of Patent: Oct. 13, 2020

(54) METHOD OF METAL GATE FORMATION AND STRUCTURES FORMED BY THE SAME

(71) Applicant: TAIWAN SEMICONDUCTOR MANUFACTURING COMPANY LTD., Hsinchu (TW)

(72) Inventors: Yi-Jing Lee, Hsinchu (TW); Ya-Yun Cheng, Taichung (TW); Hau-Yu Lin, Kaohsiung (TW); I-Sheng Chen, Taipei (TW); Chia-Ming Hsu, Hualien County (TW); Chih-Hsin Ko, Kaohsiung County (TW); Clement Hsingjen Wann, Carmel, NY (US)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/372,178

(22) Filed: Apr. 1, 2019

(65) Prior Publication Data

US 2020/0135589 A1 Apr. 30, 2020

Related U.S. Application Data

(60) Provisional application No. 62/753,319, filed on Oct. 31, 2018.

(51) Int. Cl.
| | | |
|---|---|---|
| *H01L 21/8238* | (2006.01) | |
| *H01L 27/092* | (2006.01) | |
| *H01L 29/49* | (2006.01) | |
| *H01L 21/321* | (2006.01) | |
| *H01L 21/02* | (2006.01) | |
| *H01L 21/28* | (2006.01) | |
| *H01L 29/66* | (2006.01) | |

(52) U.S. Cl.
CPC ......... *H01L 21/823842* (2013.01); *H01L 21/02068* (2013.01); *H01L 21/28088* (2013.01); *H01L 21/321* (2013.01); *H01L 27/0922* (2013.01); *H01L 29/4966* (2013.01); *H01L 29/66545* (2013.01)

(58) Field of Classification Search
CPC ......... H01L 21/823842; H01L 27/0922; H01L 29/4966; H01L 21/321; H01L 21/02068; H01L 21/28088
See application file for complete search history.

(56) References Cited

U.S. PATENT DOCUMENTS

2015/0145054 A1* 5/2015 Bu .............. H01L 21/31144 257/368
2019/0164747 A1* 5/2019 Chang .......... H01L 21/823864

* cited by examiner

*Primary Examiner* — Anthony Ho
(74) *Attorney, Agent, or Firm* — WPAT, P.C., International Property Attorneys; Anthony King

(57) ABSTRACT

A method of forming a semiconductor structure includes: providing a substrate; forming a first pair of source/drain regions in the substrate; disposing an interlayer dielectric layer over the substrate, the interlayer dielectric layer having a first trench between the first pair of source/drain regions; depositing a dielectric layer in the first trench; depositing a barrier layer over the dielectric layer; removing the barrier layer from the first trench to expose the dielectric layer; depositing a work function layer over the dielectric layer in the first trench; and depositing a conductive layer over the work function layer in the first trench.

20 Claims, 22 Drawing Sheets

METHOD OF METAL GATE FORMATION AND STRUCTURES FORMED BY THE SAME

PRIORITY CLAIM AND CROSS-REFERENCE

This application claims priority to U.S. Provisional Application No. 62/753,319 filed Oct. 31, 2018, the disclosure of which is hereby incorporated by reference in its entirety.

BACKGROUND

As technologies evolve, design and manufacturing of semiconductor devices become more complicated in view of their smaller dimensions, increased functionality and more complicated circuitries. Therefore, there is a continuous need to modify the methods of manufacturing the semiconductor devices and structures thereof in order to improve device robustness as well as reduce cost and processing time. Accordingly, there has been a particular focus on improving the performance of metal gate (MG) electrodes in the transistor. One process of forming the MG electrode is known as the gate-last process, while another formation process is termed the gate-first process. The gate-last process allows for a reduced number of subsequent processes, including high-temperature operations, that are performed after formation of the gate.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
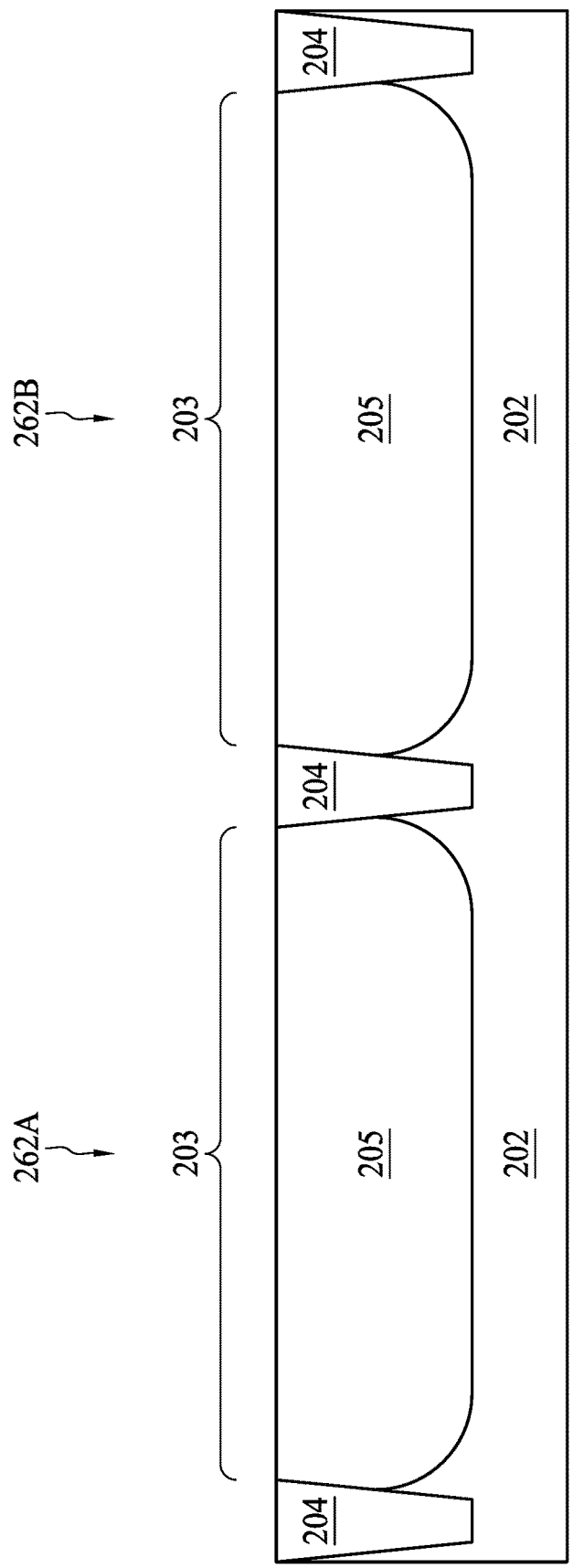
FIGS. 1A to 1T are schematic cross-sectional diagrams showing intermediate stages of a method of manufacturing a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" or "substantially" generally mean within 10%, 5%, 1% or 0.5% of a given value or range. Alternatively, the terms "about," "substantial" or "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The present disclosure relates generally to the field of semiconductor devices, and relates more particularly to the manufacturing method of the metal gate and the resulting semiconductor structure.

As technology progresses towards advanced nodes and beyond, the task of forming the metal gate (MG) electrode has become more challenging. For example, the filling capability is degraded due to the increased aspect ratio of the trench in the MG. Moreover, it is increasingly difficult to seek the balance of threshold voltages of various MG electrodes between N-type transistors and P-type transistors. In addition, the tighter requirement of low threshold voltages, e.g., in N-type transistors, makes the process control for MG electrodes more complicated. Also, a higher gate resistance in some MG electrodes may not be desirable. Existing methods have adopted one or more layers, e.g., barrier layers, to reduce leakage current of the MG electrode for improving device reliability. However, the thickened barrier layer may make the tuning of the work function layer less effective, resulting in a higher threshold voltage. The thickened barrier layers will also limit the space available for the filling metal of the MG electrode, thereby increasing the MG electrode resistance. In some examples, the barrier layer may have uneven thicknesses, e.g., the thickness of the barrier layer around the bottom corner is greater than that at the bottom center. Diminished performance of the MG electrode may result.

In the present disclosure, an MG electrode formation scheme is proposed to improve the performance of the MG electrode. Based on different target threshold voltages in different transistors, the barrier layers in selected MG electrodes, that are already formed, are reduced or removed subsequent to some operations, so that different barrier layer thicknesses can be achieved in the finalized MG electrodes of various transistors. The threshold voltage control among different transistors can be effectively improved with higher design and manufacturing flexibility according to requirements. A good filling performance and corner profile control of the MG electrode may be achieved. Moreover, an enlarged filling area for the filling material in the MG electrode is obtained, especially around the bottom of the MG, thereby reducing the MG resistance. Additionally, extra thermal treatments are provided to reduce or eliminate the leakage problem due to the thinned barrier layer in some of the MG electrode.

Figure 1B:
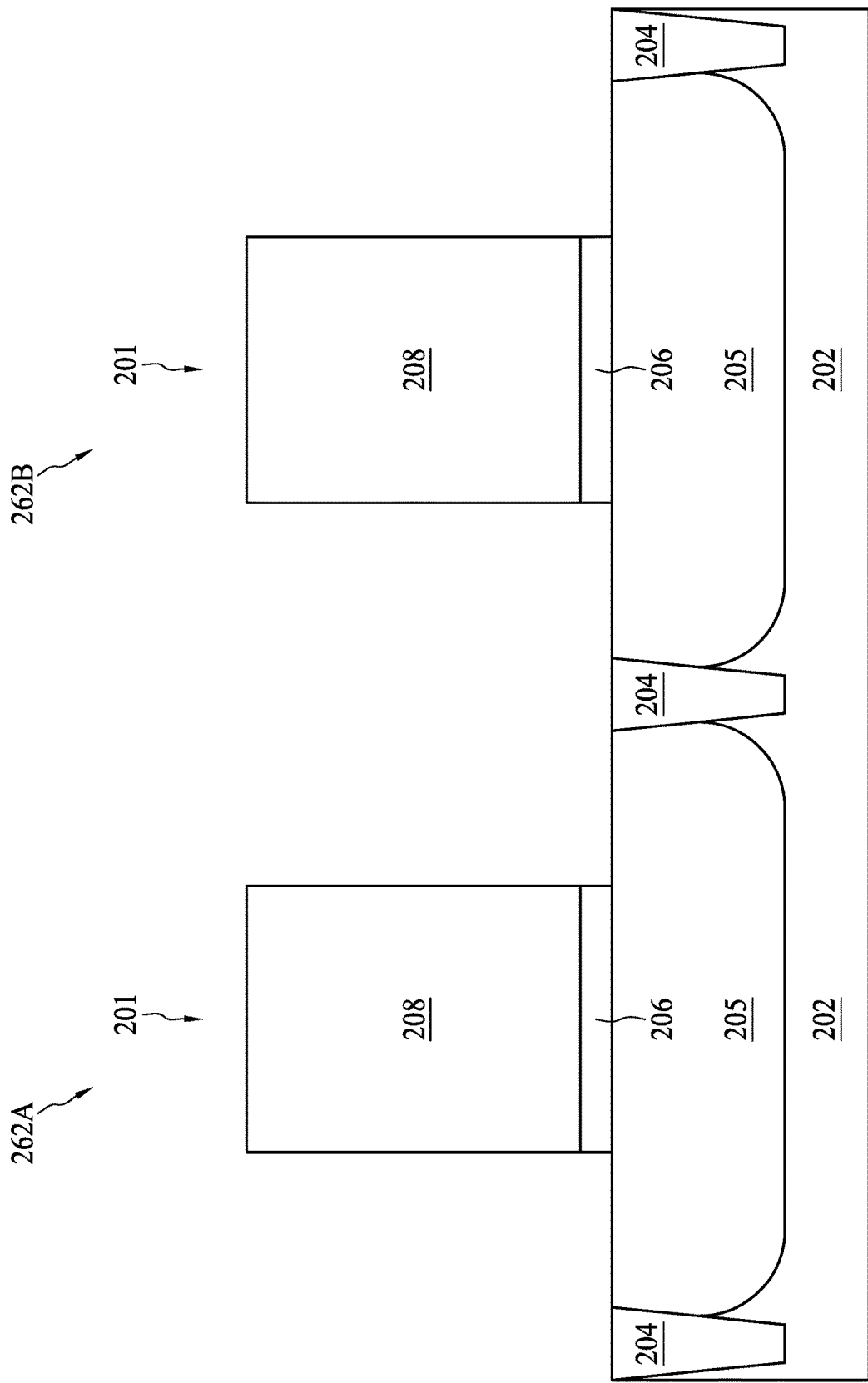
Figure 1C:
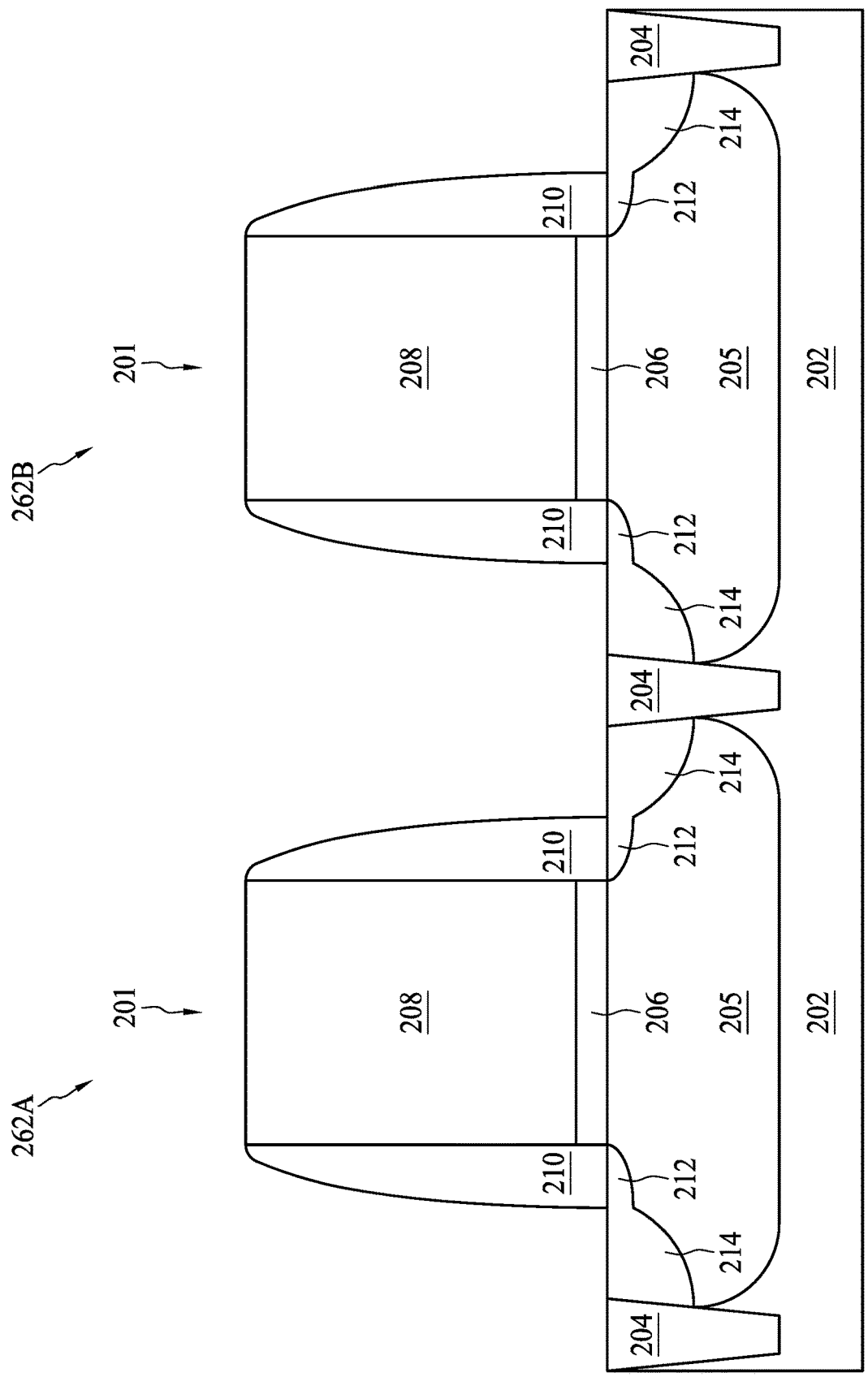
Figure 1D:
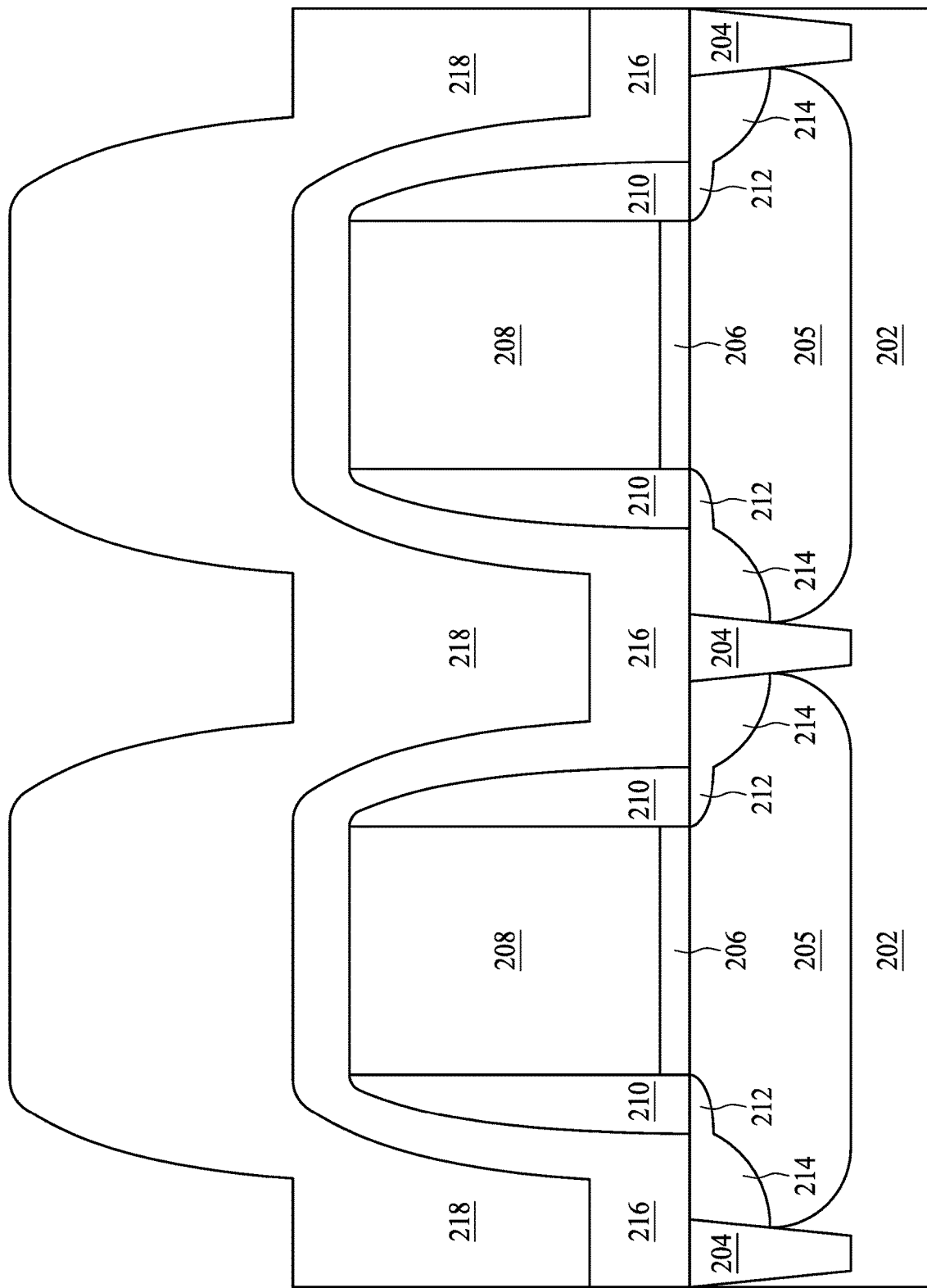
Figure 1E:
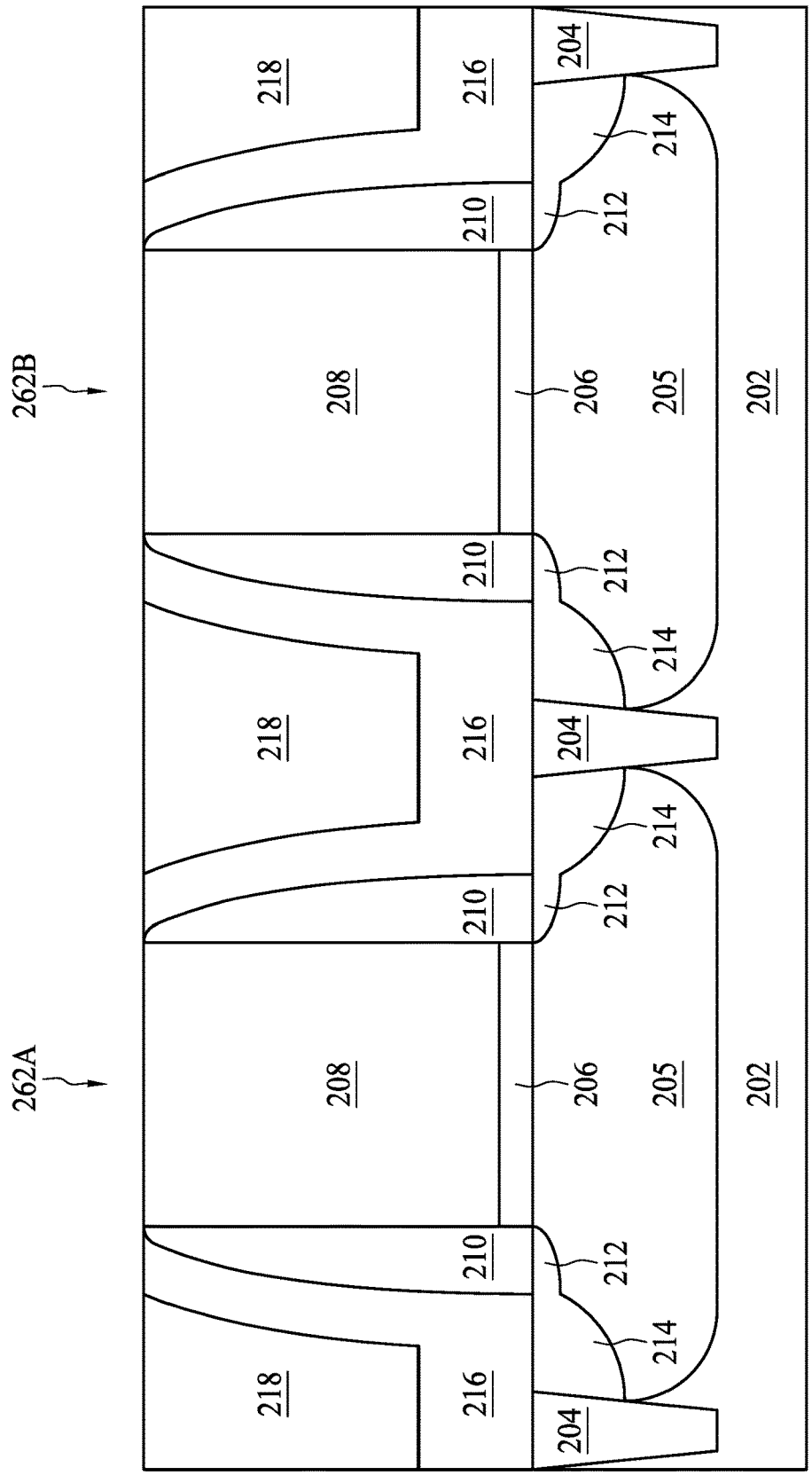
Figure 1F:
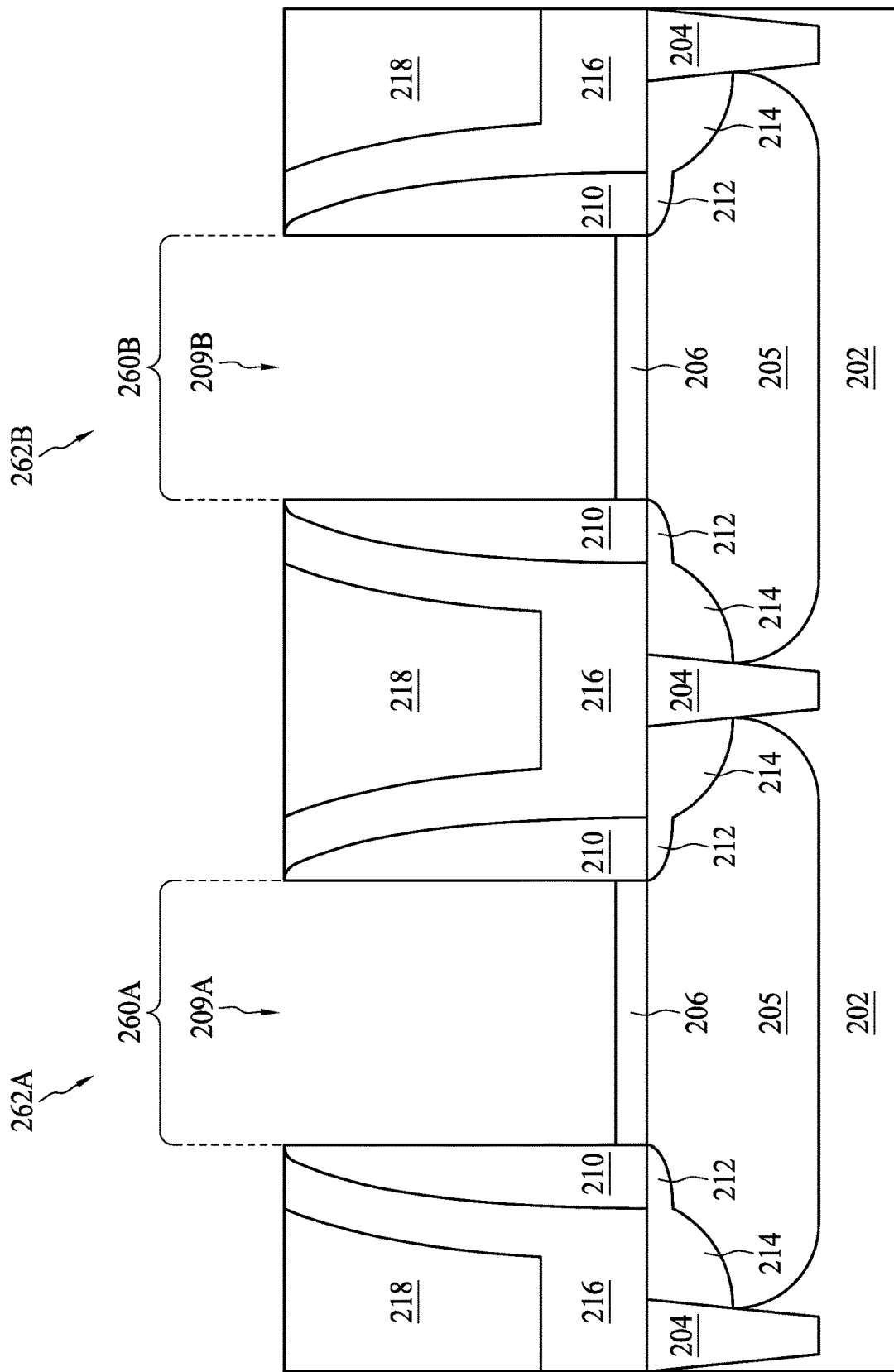
Figure 1G:
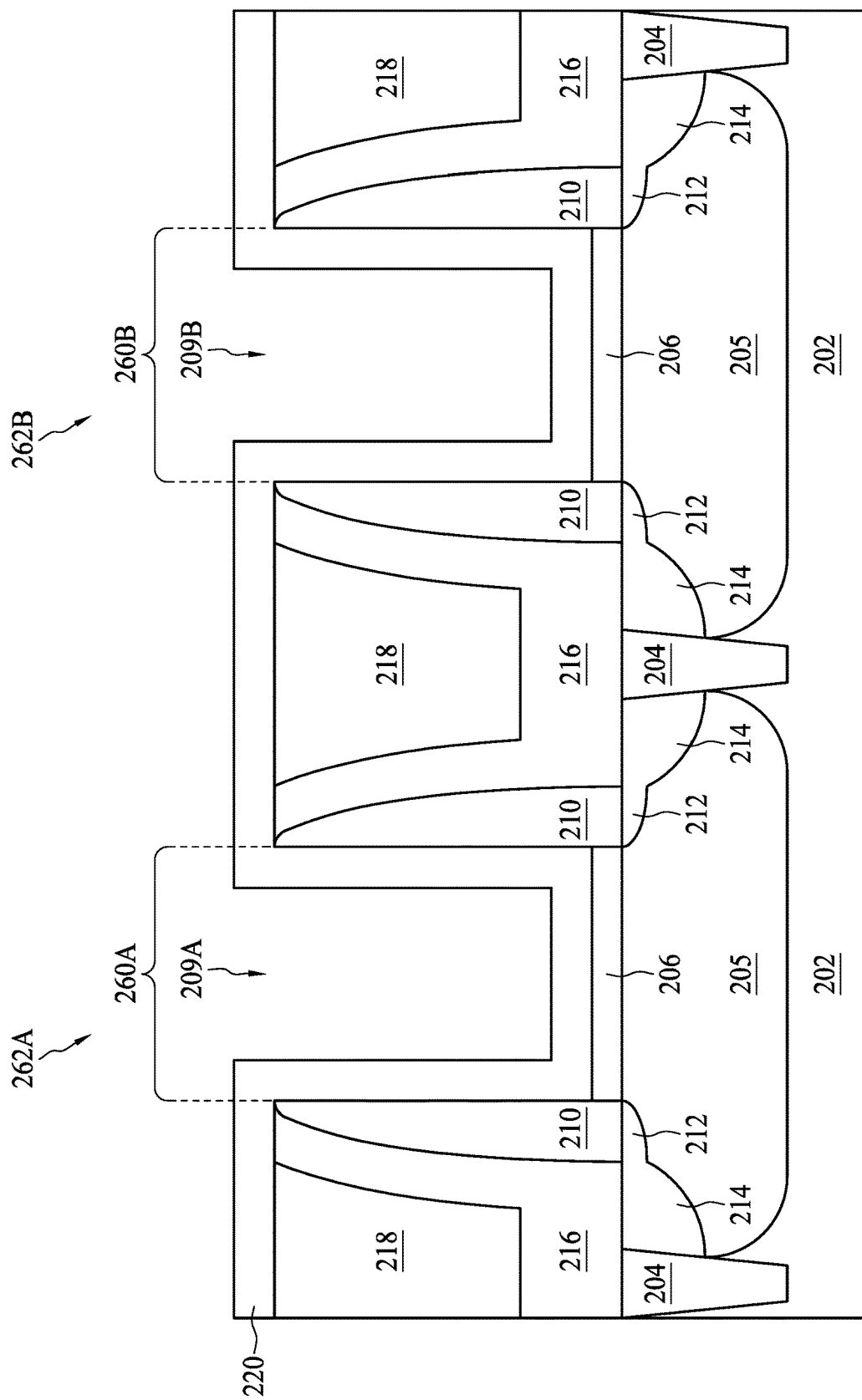
Figure 1H:
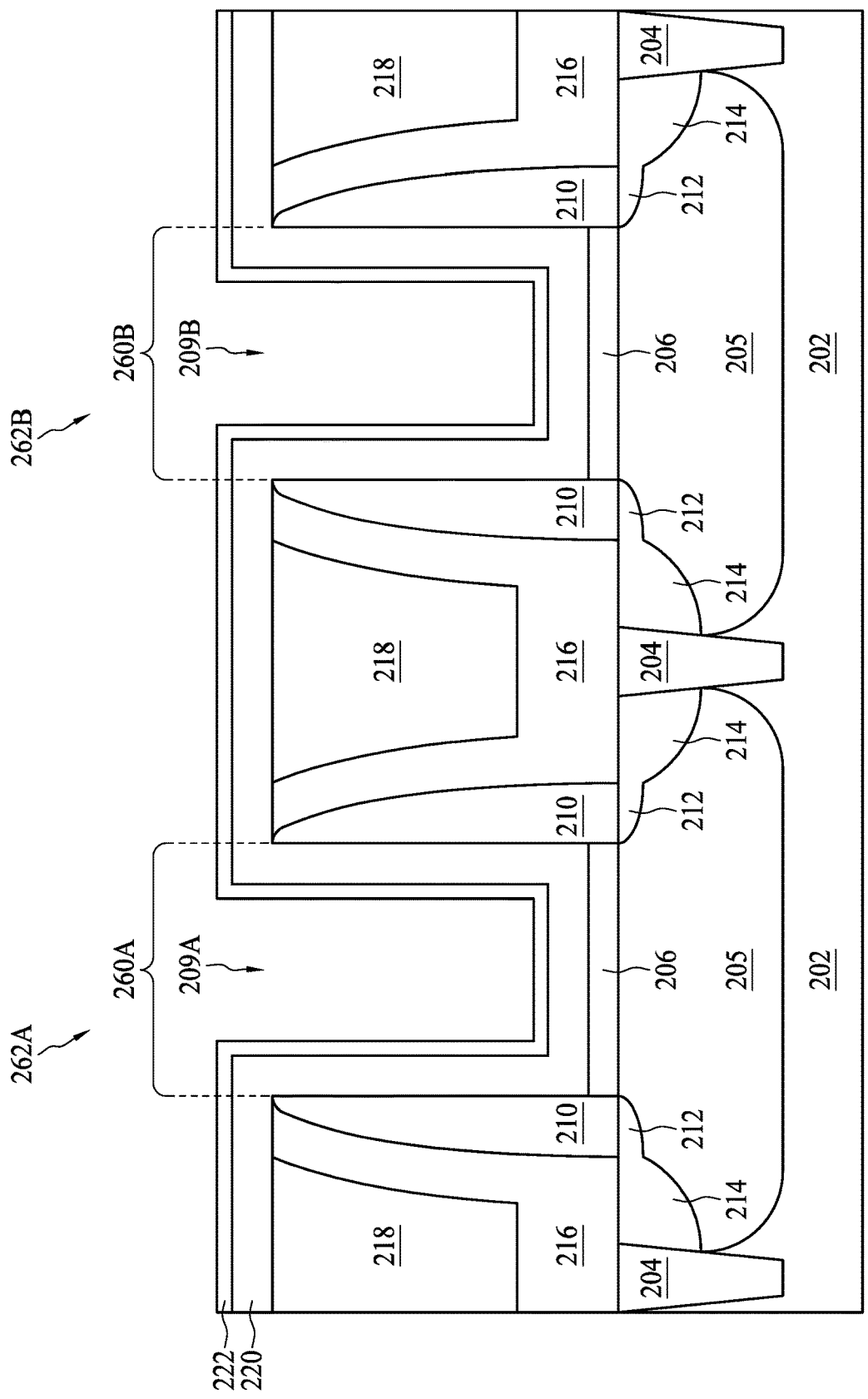
Figure 1I:
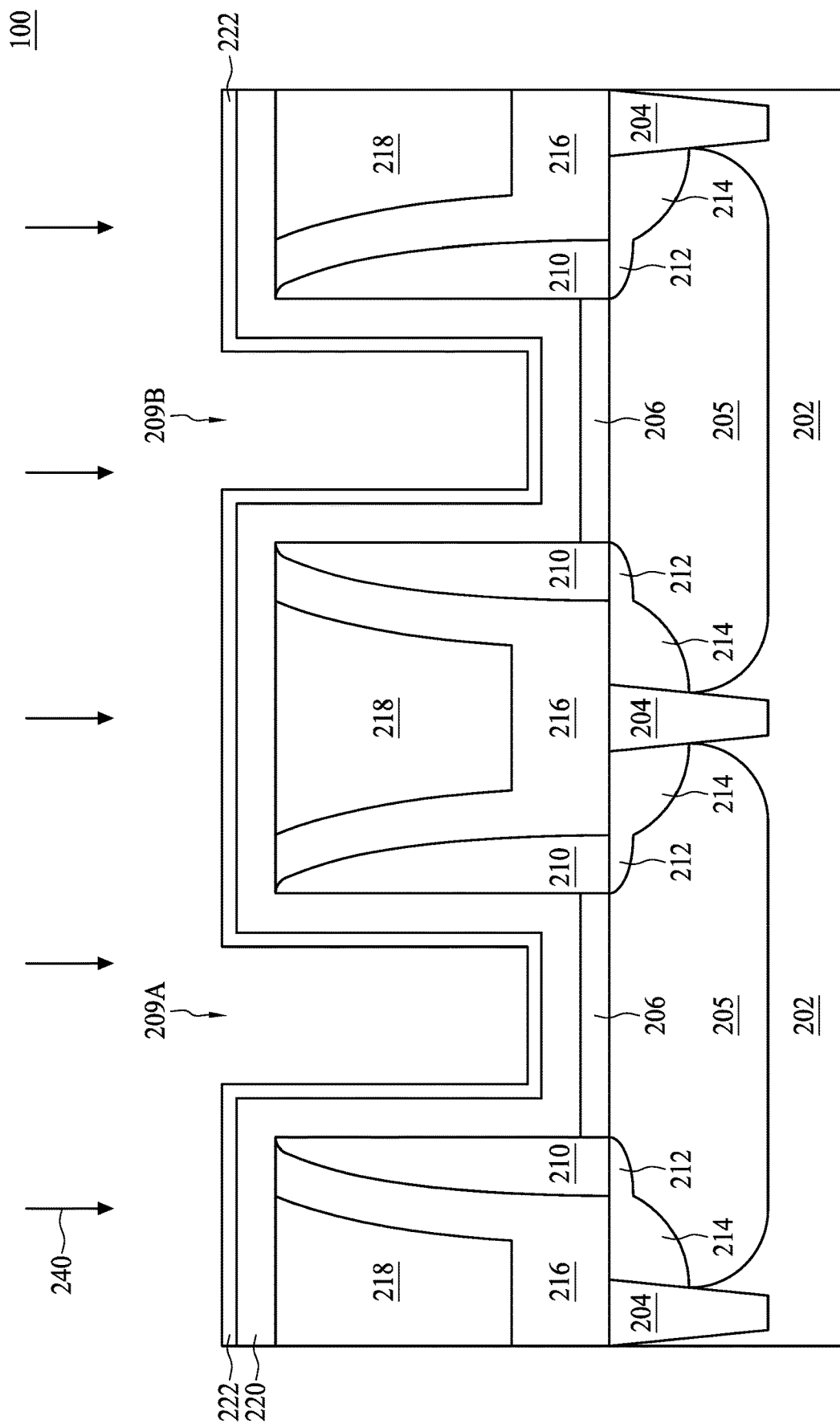
Figure 1J:
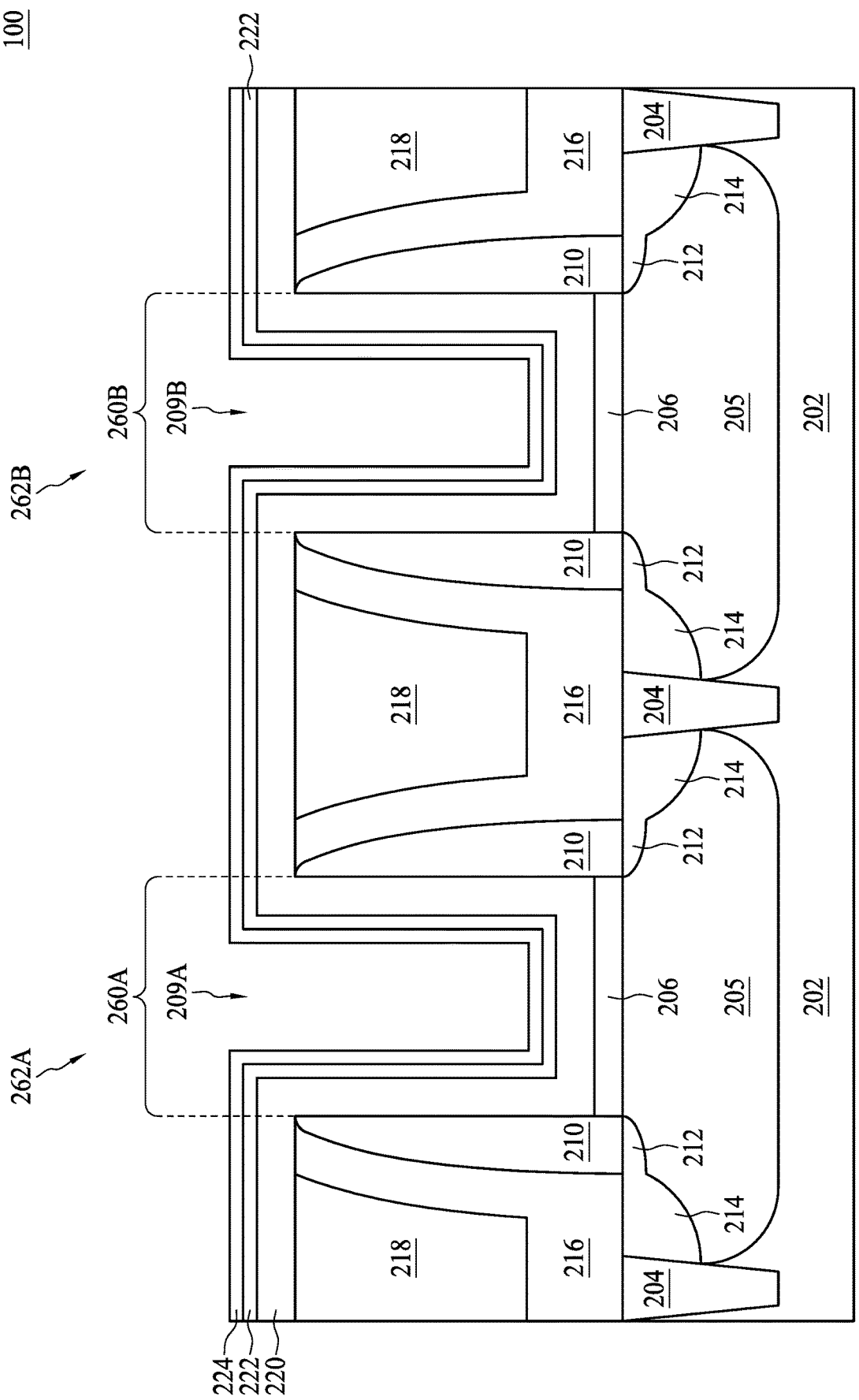
Figure 1K:
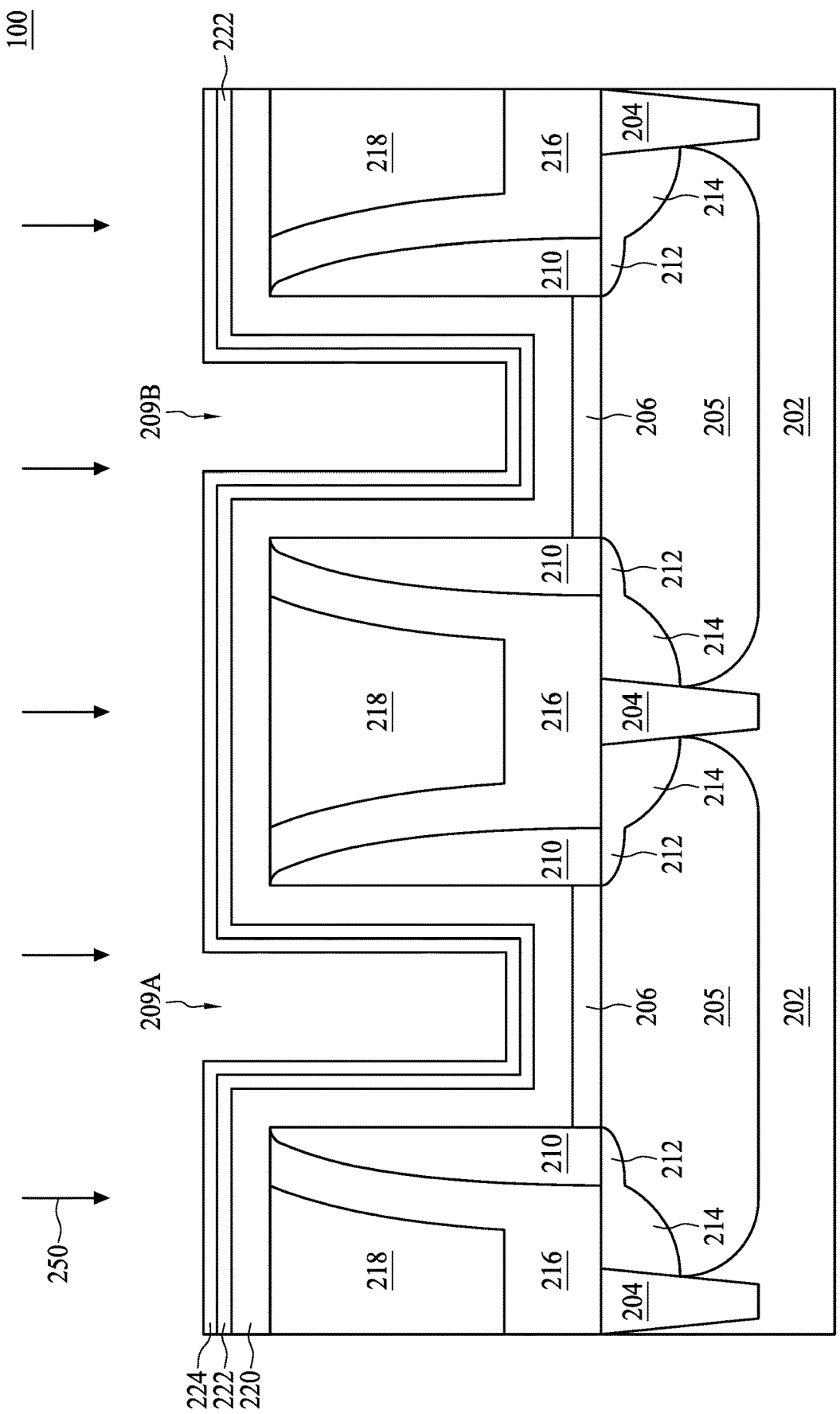
Figure 1L:
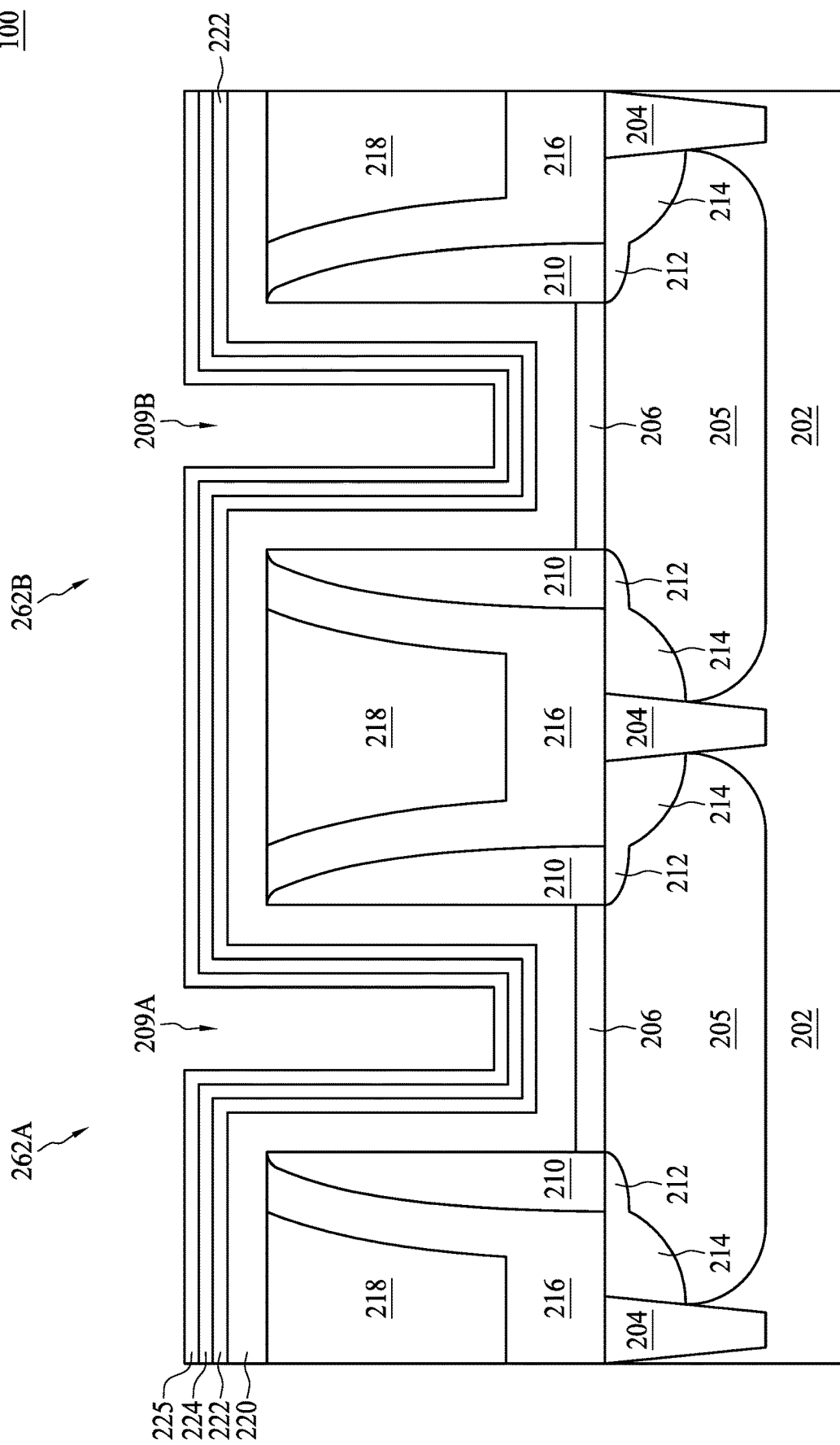
Figure 1M:
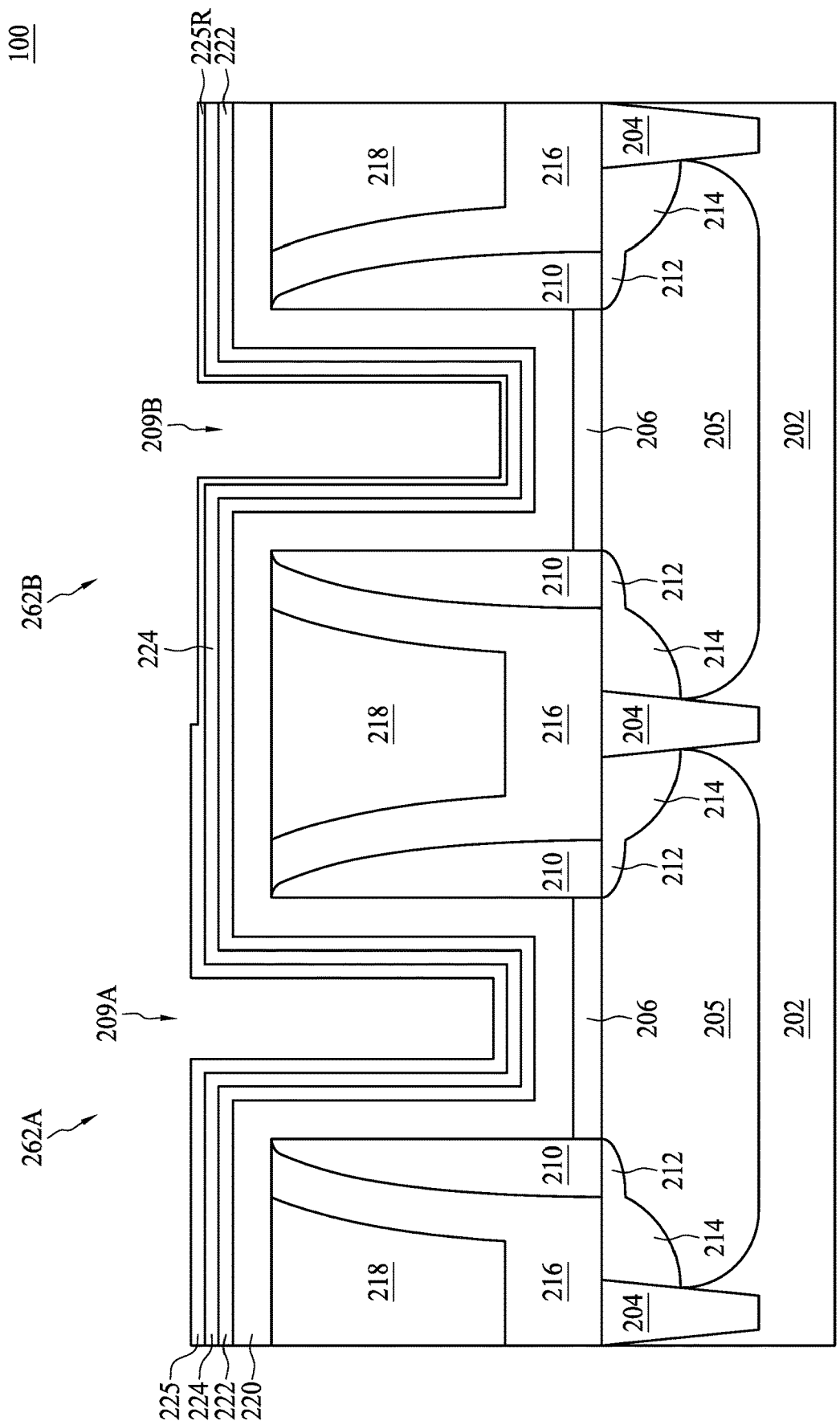
Figure 1N:
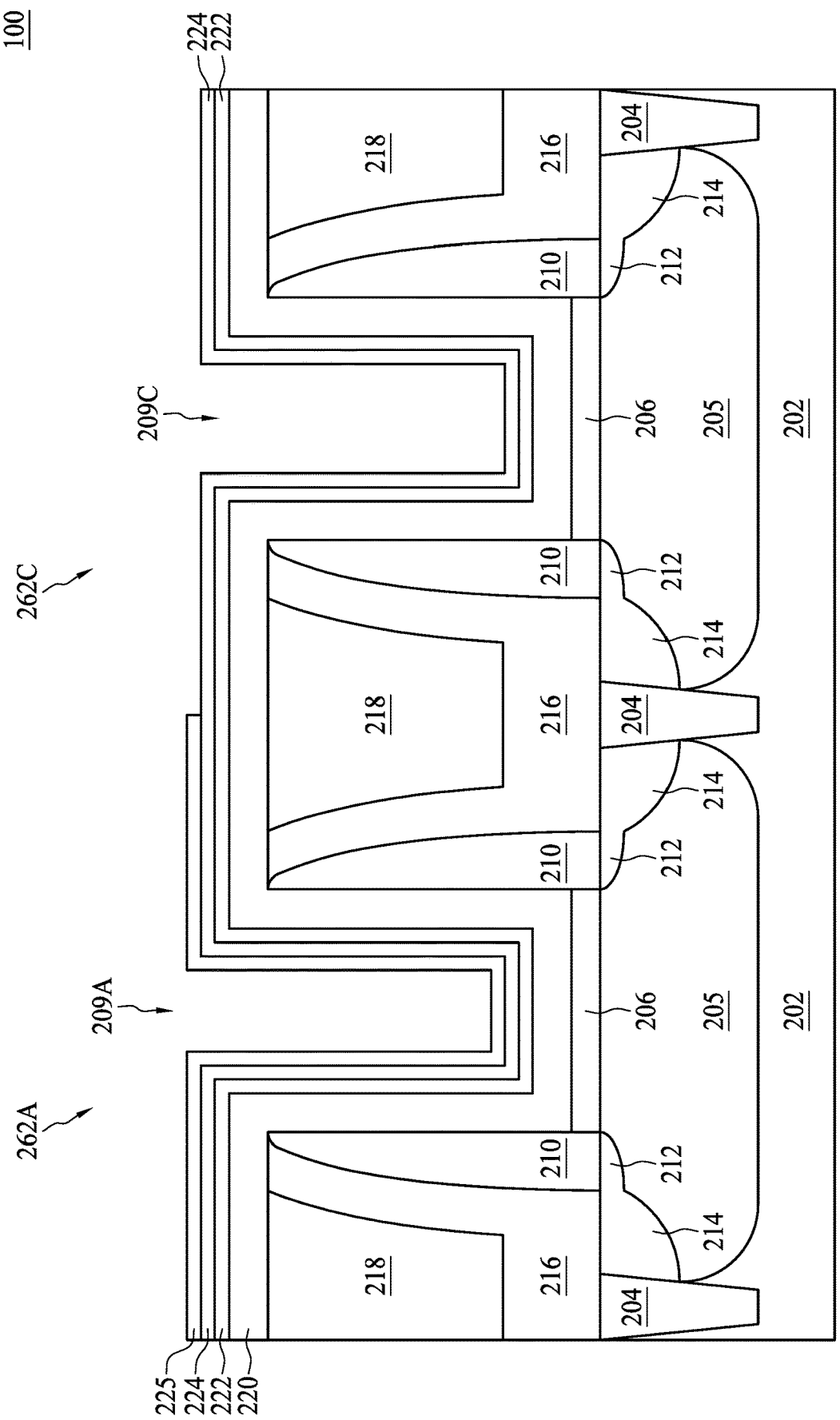
Figure 10:
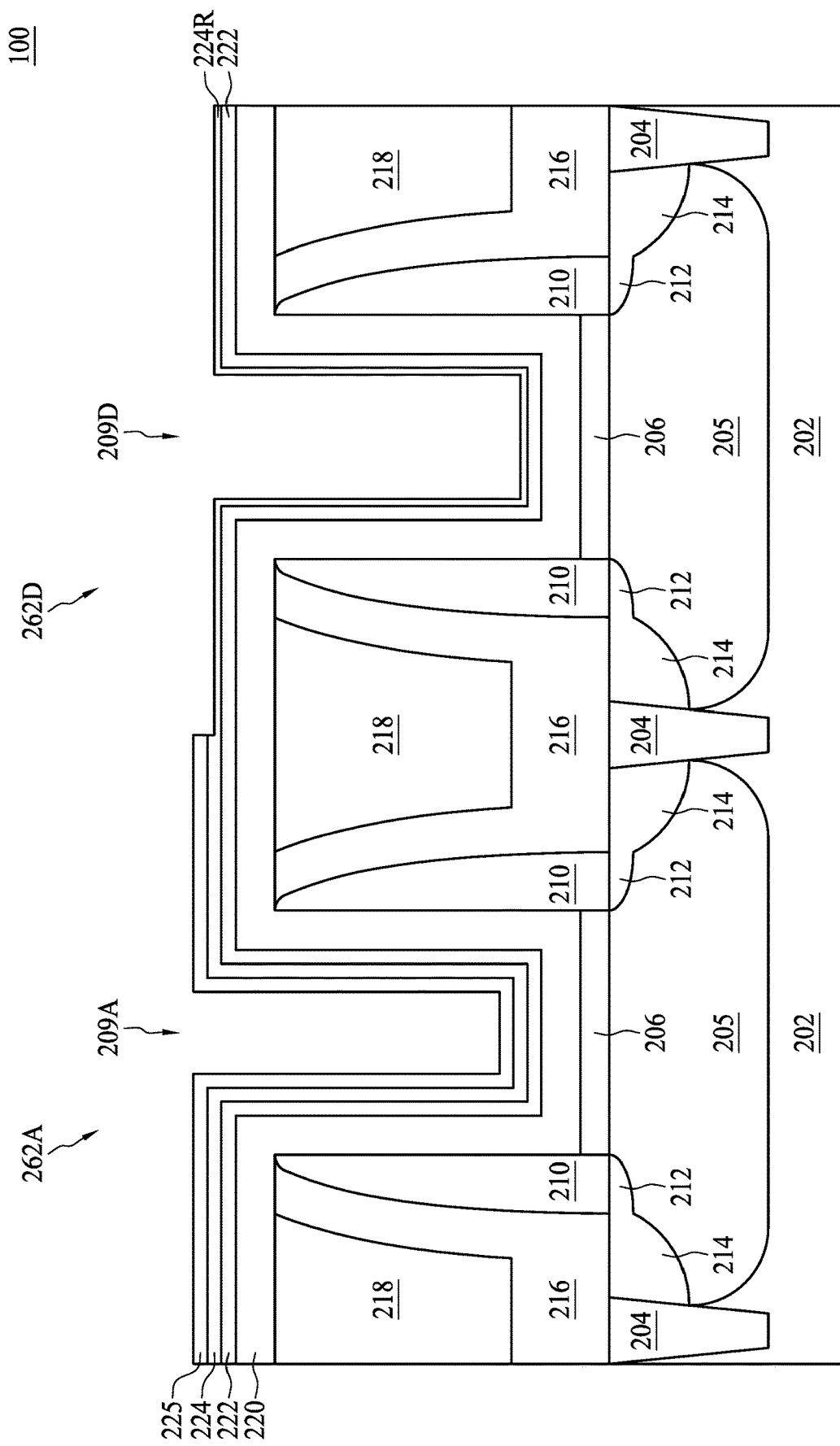
Figure 1P:
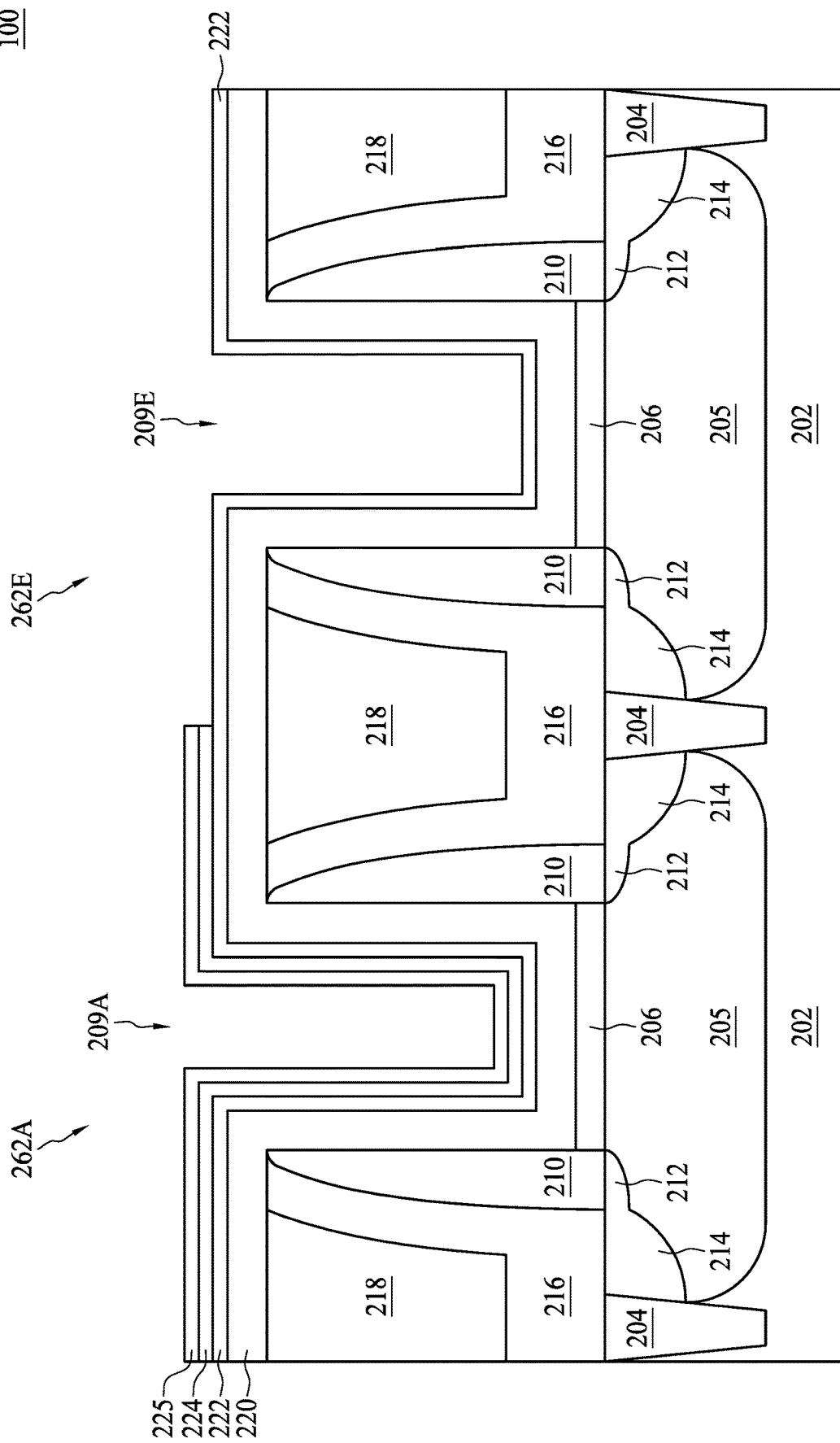
Figure 1Q:
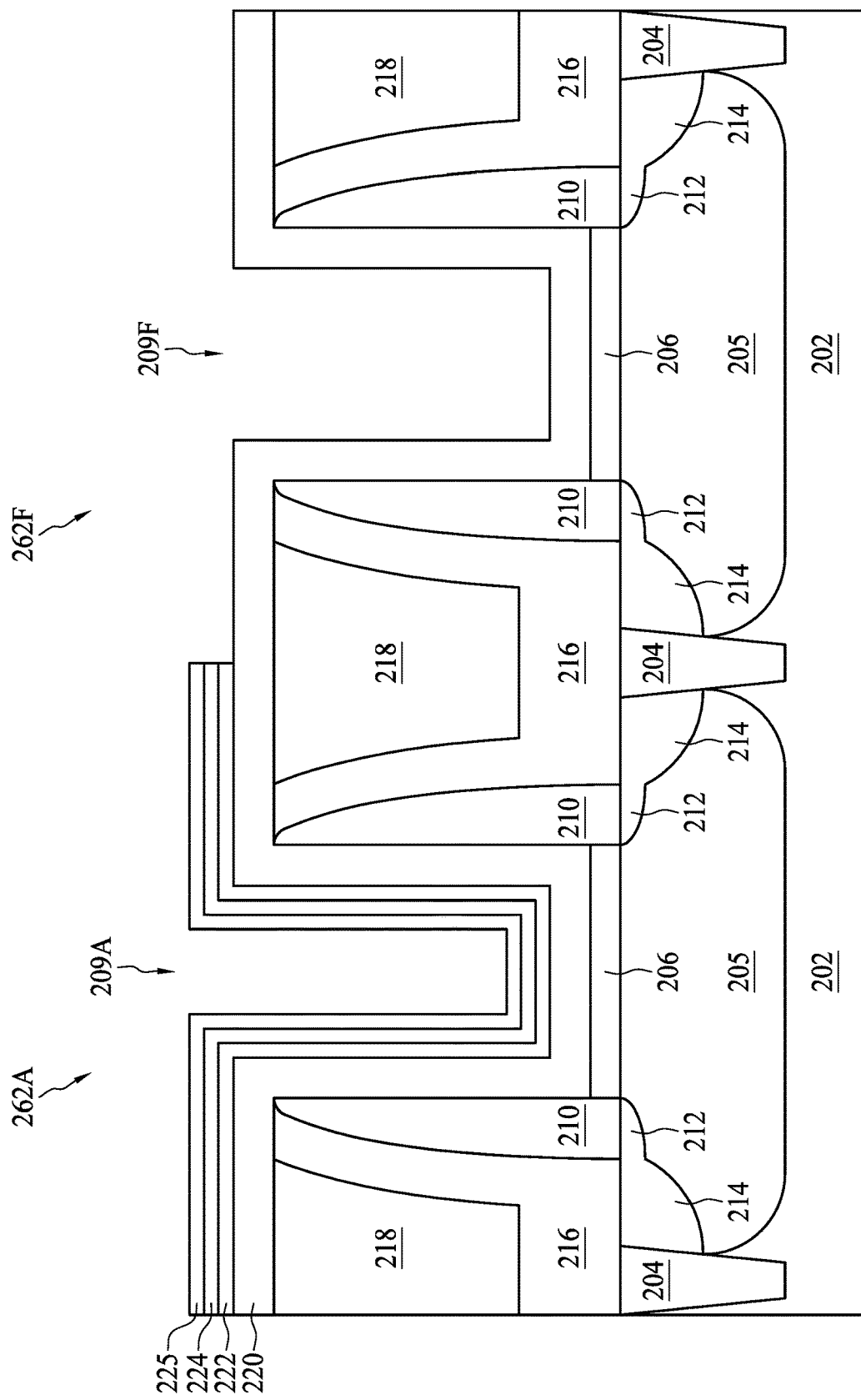
Figure 1R:
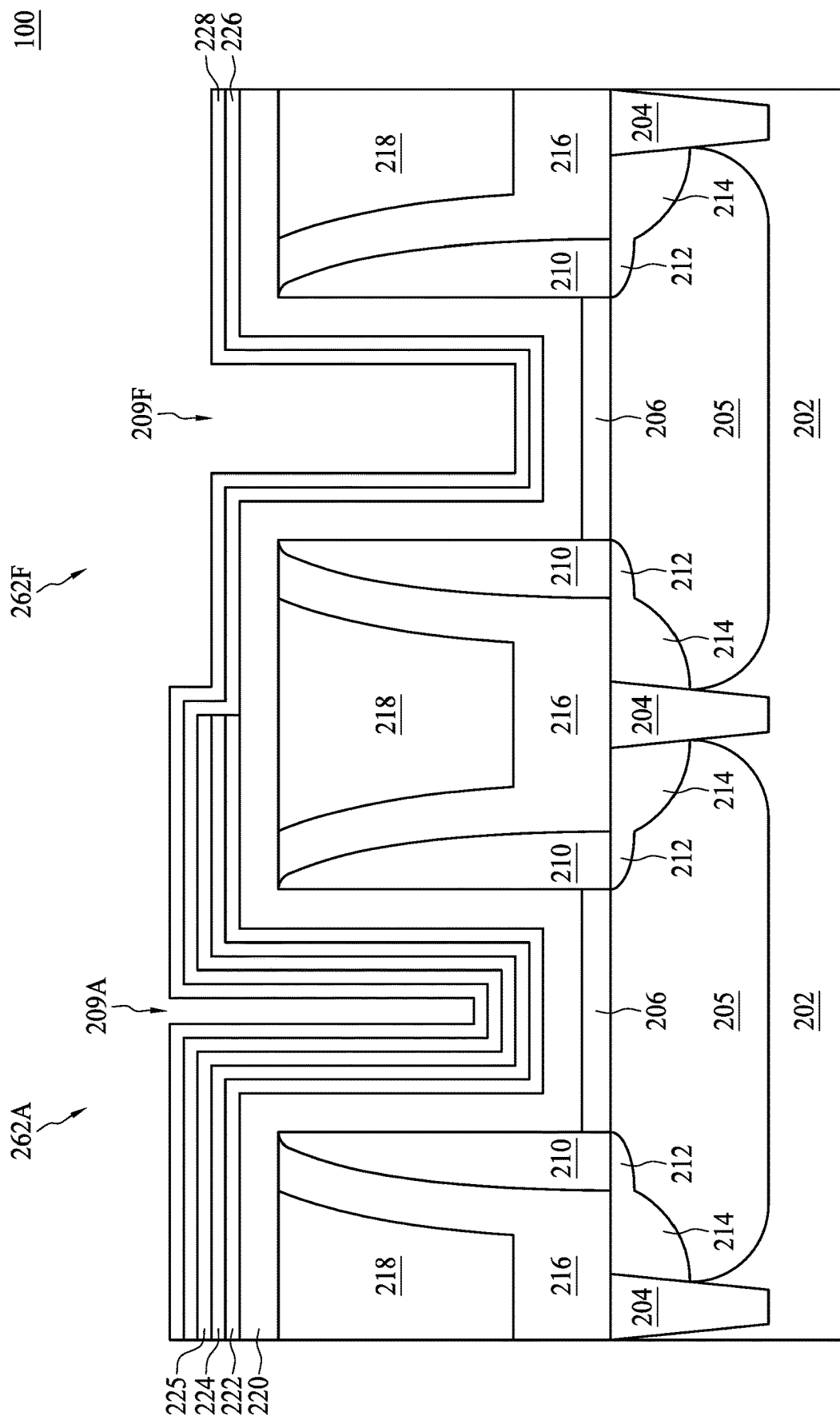
Figure 1S:
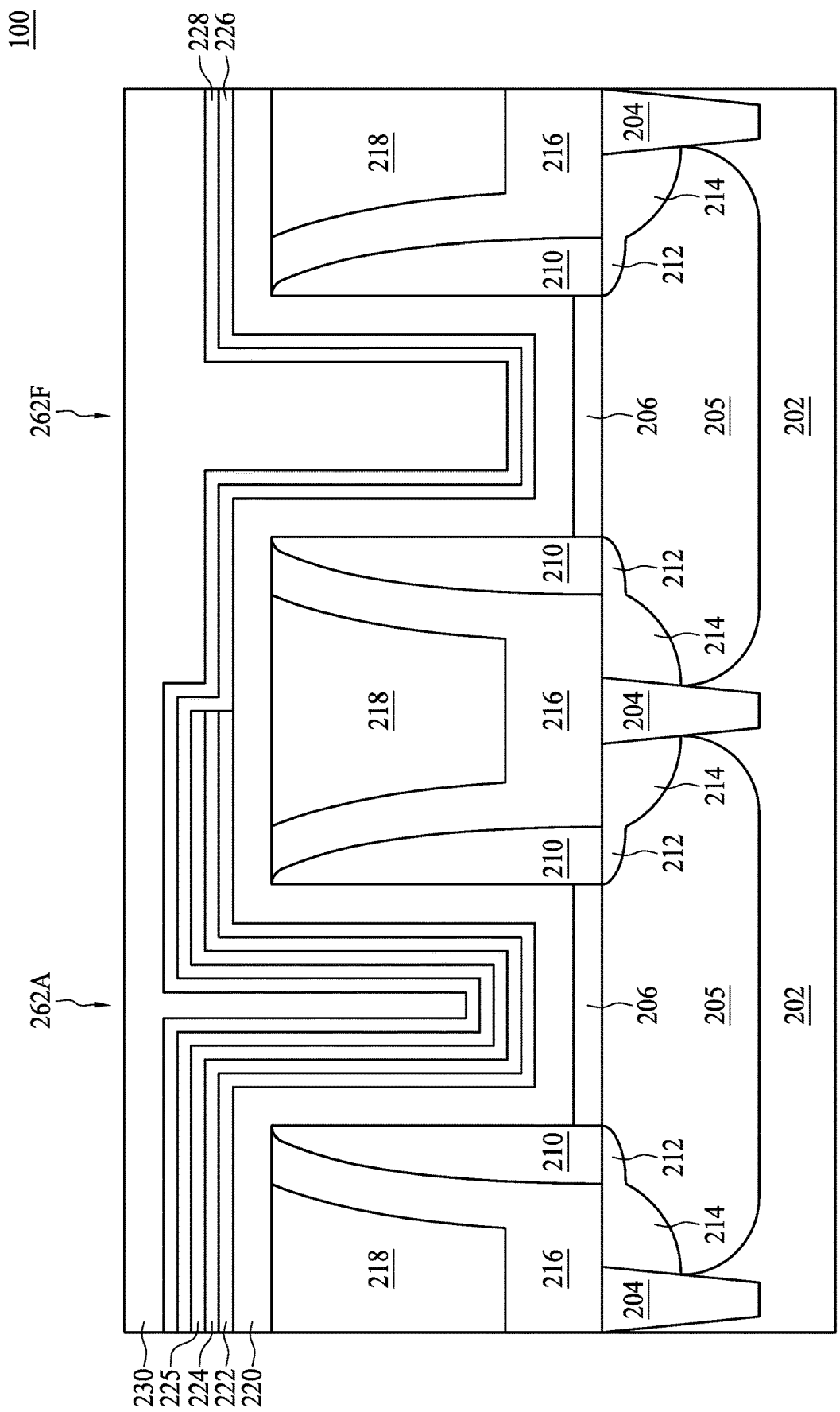
Figure 1T:
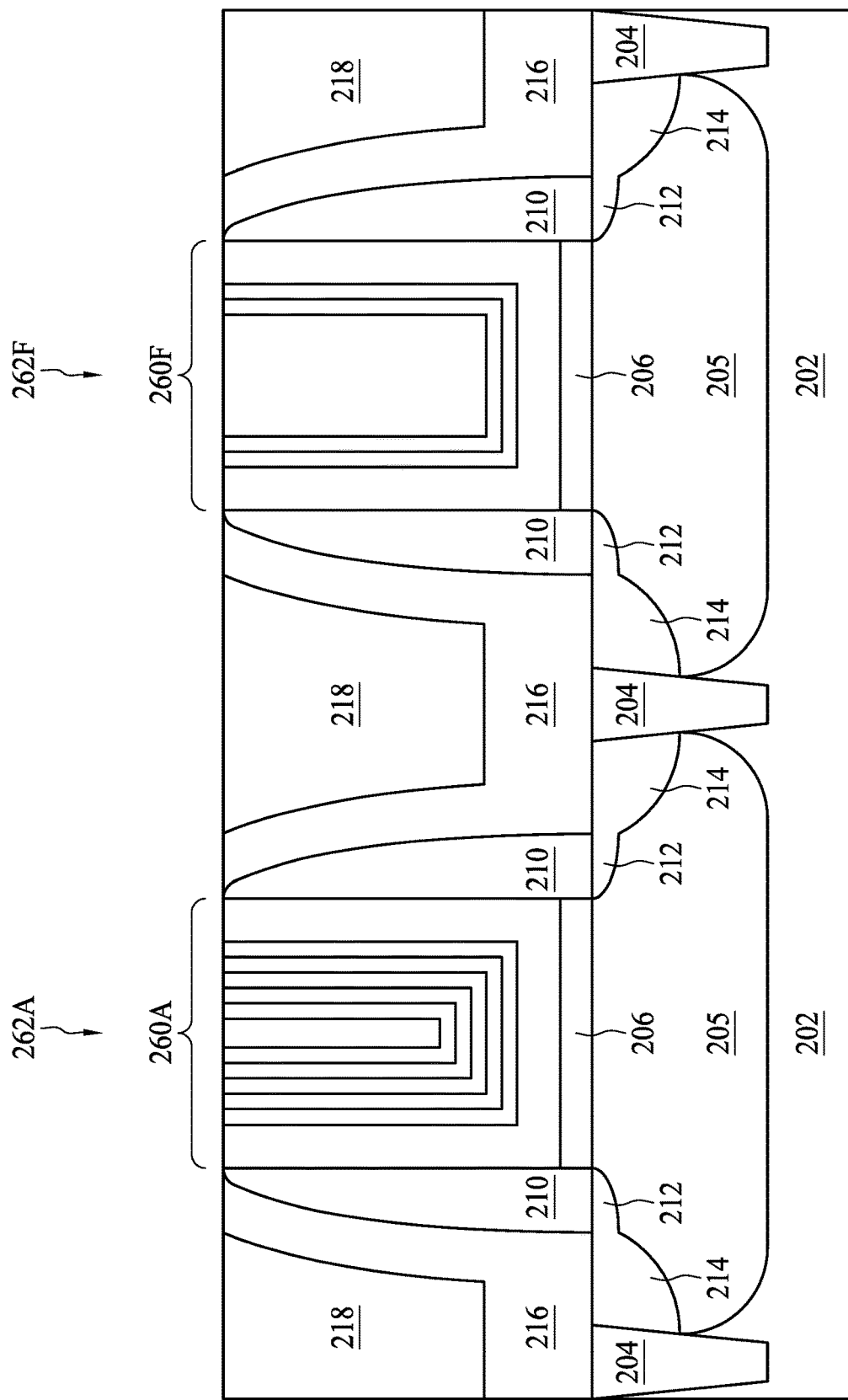

FIGS. 1A to 1T are schematic cross-sectional diagrams showing intermediate stages of a method of manufacturing a semiconductor device 100, in accordance with some embodiments. In an embodiment, the semiconductor device 100 includes one or more metal-oxide semiconductor (MOS) field effect transistors (FETs). Although a planar FET device is shown for illustrative purposes, other device configurations are also possible, such as fin-type FET (FIN-FET), gate-all-around (GAA) FET and the like. Referring to FIG. 1A, a substrate 202 is provided. In an embodiment, the substrate 202 is a semiconductor substrate, e.g., a silicon substrate. Other examples of the substrate 202 may include other elementary semiconductors such as germanium. Alternatively, the substrate 202 may include a compound semiconductor, such as silicon carbide, gallium arsenide, indium arsenide, or indium phosphide. The substrate 202 may include different dopant types, such as P-type substrate or an N-type substrate, and may include various doping configurations depending on design requirements. Further, the substrate 202 may include an epitaxial layer (epi layer) or may include a silicon-on-insulator (SOI) structure.

One or more isolation structures 204 may be formed on the substrate 202. The isolation structures 204 may utilize isolation technology, such as local oxidation of silicon (LOCOS) or shallow trench isolation (STI). In the present embodiment, the isolation structure 204 includes an STI. The isolation structures 204 may comprise silicon oxide, silicon nitride, silicon oxynitride, fluoride-doped silicate glass (FSG), a low-K dielectric material, other suitable materials, or combinations thereof. An exemplary operation of forming the isolation structures 204 may include patterning the substrate 202 by a photolithography operation, etching a trench in the substrate 202 using, for example, a dry etching, a wet etching, or a plasma etching operation, and depositing a dielectric material in the trench.

The isolation structures 204 are used to define active regions 203 for a first FET device 262A and a second FET device 262B. The active regions 203 may include various doping configurations, e.g., configurations doped with P-type or N-type dopants. For example, the active regions 203 may be doped with P-type dopants such as boron or $BF_2$ or N-type dopants such as phosphorus or arsenic. The active regions 203 may act as regions configured for N-type MOS (NMOS) transistors or P-type MOS (PMOS) transistors. In an embodiment, doped wells 205 are formed in the active regions 203 between the isolation structures 204 for different types of MOS transistors. The dopant type of the doped wells 205 may be the same or different from the substrate 202. In embodiments where an NMOS device (e.g., FET device 262B) is to be formed in the active regions 203, a P-type doped well 205 may be formed through implanting a P-type impurity, which may be boron, indium, or the like, into substrate 202. In other embodiments where a PMOS device (e.g., FET device 262A) is to be formed in the active regions 203, an N-type doped well 205 may be formed through implanting an N-type impurity, which may be phosphorus, arsenic, antimony, or the like, into substrate 202. In some embodiments, the doped well 205 is absent from the active region 203. In the illustrative embodiment of FIG. 1A, the FET devices 262A and 262B may be of the same type of different types.

Referring to FIG. 1B, two dummy gate structures 201 are formed over the substrate 202. In the present embodiment, each dummy gate structure 201 is comprised of a dielectric layer 206 and a dummy gate electrode 208. The dielectric layer 206 may comprise silicon oxide, silicon oxynitride, high-k dielectric materials or a combination thereof. In some embodiments, the dummy gate electrode 208 includes a single layer or multilayer structure. In the present embodiment, the dummy gate electrode 208 includes polysilicon. The dummy gate structure 201 may be formed by depositing materials of the dielectric layer 206 and the dummy gate electrode 208 over the substrate 202 in a blanket manner. The deposition step may include physical vapor deposition (PVD), chemical vapor deposition (CVD), atomic layer deposition (ALD) or other suitable methods. A photoresist (not shown) is formed over the deposited materials and patterned. An etching operation is performed to transfer the features of the patterned photoresist to the underlying layers so as to form the dummy gate structure 201. In an embodiment, the dummy gate structure 201 includes additional dielectric layers or conductive layers, e.g., hard mask layers, interfacial layers, capping layers or combinations thereof.

Referring to FIG. 1C, lightly doped source/drain (LDD) regions 212 are formed in the respective doped wells 205 on two sides of each of the dummy gate structures 201. In an embodiment, the LDD regions 212 are formed between the isolation structures 204 and the dummy gate structures 201. The LDD regions 212 may be formed in the substrate 202 by an implantation operation, such as an ion implantation step. The LDD regions 212 may include a dopant type opposite to the respective doped wells 205. In an embodiment, the LDD regions 212 may be doped with P-type dopants, such as boron or $BF_2$; N-type dopants, such as phosphorus or arsenic; or combinations thereof. In an embodiment, the LDD regions 212 are aligned with a sidewall of the dummy gate structure 201.

Subsequent to the forming of the LDD regions 212, spacers 210 are formed on each side of the dummy gate structures 201. The gate spacers 210 may comprise a dielectric material such as silicon nitride, silicon oxide, silicon carbide, silicon oxynitride or combinations thereof. In an embodiment, the spacers 210 comprise a multilayer structure. The spacers 210 may be formed using deposition operations, such as PVD, CVD or ALD, or etching operations. The etching operation may be an anisotropic etching.

Source/drain (S/D) regions 214 may be formed in the respective doped wells 205 between the isolation structures 204 and the spacers 210. The S/D regions 214 may be doped with P-type dopants, such as boron or $BF_2$; N-type dopants, such as phosphorus or arsenic; or combinations thereof. The S/D regions 214 may include a dopant type same as that of the LDD regions 212 while having a greater doping concentration than the LDD regions 212. In an embodiment, the S/D regions 214 are formed using an ion implantation step and the implanted profiles are substantially aligned with outer sidewalls of the spacers 210. In some embodiments, one or more contact features (e.g., silicide regions, not separately shown) may be formed on the S/D regions 214 using a silicidation operation. In some embodiments, the S/D regions 214 may be formed by epitaxial growth. In some embodiments, the S/D regions 214 may have a raised surface higher than the surface of the substrate 202.

An etch stop layer (ESL) 216 is formed over the substrate 202 and surrounding the dummy gate structures 201 and the spacers 21, as illustrated in FIG. 1D. The ESL 216 may include silicon nitride, silicon oxide, silicon oxynitride or other suitable materials. The ESL 216 may be formed using any suitable operation, such as PVD, CVD or ALD. In the present embodiment, the ESL 216 is a contact etch stop layer (CESL) including silicon nitride.

Still referring to FIG. 1D, an interlayer (or inter-level) dielectric (ILD) layer 218 is subsequently formed over the ESL 216. The ILD layer 218 may fill the gaps between the dummy gate structures 201 and surrounding the ESL layer 216. The ILD layer 218 may comprise a dielectric material and is formed by any suitable deposition operation. The dielectric material may comprise silicon oxide, silicon nitride, silicon oxynitride, spin-on glass (SOG), fluorinated silica glass (FSG), polyimide or other suitable dielectric materials. In some embodiments, the ILD layer 218 may include a high density plasma (HDP) dielectric material (e.g., HDP oxide) and/or a high aspect ratio process (HARP) dielectric material (e.g., HARP oxide).

FIG. 1E illustrates a result of a planarization operation performed to remove excess portions of the ILD layer 218 and the ESL layer 216. The planarization operation may include a chemical mechanical polish (CMP) operation or mechanical grinding. The top surfaces of the dummy gate electrodes 208 are exposed accordingly. In an embodiment, the top surfaces of the ILD layer 218, the ESL layer 216 and the dummy gate electrode 208 are leveled by the planarization operation.

Subsequently, a first metal gate stack 260A and a second metal gate stack 260B for the respective FET devices 262A and 262B, respectively, are to be formed in place of the corresponding dummy gate structures 201. Initially, each dummy gate electrode 208 is removed from the respective dummy gate structure 201, as shown in FIG. 1F. As a result, an exemplary first trench 209A and an exemplary second trench 209B are formed as defined by the spacers 210 and surrounded by the ESL 216 and ILD layer 218. The dummy gate electrode 208 may be removed in an etching operation, such as a wet etch, a dry etch or combinations thereof. In an embodiment, the dielectric layer 206 remains in the trench 209A and 209B after the dummy gate electrode removing operation. In alternative embodiments, the dielectric layer 206 is removed during the etching of the dummy gate electrode 208. In an embodiment, the wet etch operation for the dummy gate electrode 208 includes exposure to a hydroxide containing solution (e.g., ammonium hydroxide), deionized water, or other suitable etchant solutions.

FIG. 1G illustrates the formation of a gate dielectric layer 220 over the substrate 202. The gate dielectric layer 220 is conformally formed over the ILD layer 218, the ESL 216 and the spacers 210, and on the sidewalls and bottoms of the trenches 209A and 209B. The gate dielectric layer 220 may be formed of a high-k dielectric material, such as hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, zirconium oxide, titanium oxide, aluminum oxide, hafnium dioxide-alumina ($HfO_2$—$Al_2O_3$) alloy, other suitable high-k dielectric materials, or combinations thereof. Alternatively, the gate dielectric layer 220 may include silicon nitride, silicon oxynitride or silicon oxide. In the present embodiment, the gate dielectric layer 220 includes a high-k material along with the dielectric layer 206 as a silicon oxide layer. The gate dielectric layer 220 may be formed using PVD, CVD or other suitable deposition methods. In embodiments where the gate dielectric layer 206 is previously removed by the etching operation of FIG. 1F, the formation of the gate dielectric layer 220 may also include depositing an interfacial layer, which may be formed of silicon oxide, silicon nitride, or the like, in the bottom of the trenches 209 before forming the high-k dielectric material of the gate dielectric layer 220.

The forming of MG electrodes of the corresponding metal gate stacks 260A and 260B are described as follows. A first barrier layer 222 is deposited over the gate dielectric layer 220, as illustrated in FIG. 1H. The first barrier layer 222 comprises a material selected from a group of TiN, TiCN, TaN, TaCN, WN, WCN, TaSiN and TiSiN. In an embodiment, the first barrier layer 222 has a multilayer or a stacked structure. In an embodiment, the first barrier layer 222 is conformally deposited on sidewalls and the bottom of the gate dielectric layer 220. The first barrier layer 222 may be formed using PVD, CVD or other suitable deposition methods. The first barrier layer 222 serves various functions for the MG electrode of the semiconductor device 100. For example, the first barrier layer 222 may be used as a diffusion barrier layer that prevents metallic atoms in the overlying layers from diffusing into underlying features. Moreover, the configuration of the first barrier layer 222, such as its profile and thickness, may affect the threshold voltage of the finalized semiconductor device 100. In an embodiment, the first barrier layer 222 is adopted as a protection layer of the underlying layers such that the underlying features will not be adversely affected by subsequently performed treatments.

Referring to FIG. 1I, a first treatment 240 is performed. In an embodiment, the first treatment 240 is an annealing operation in which the substrate 202 or the layers/features of the semiconductor device 100 other than the substrate 202 are processed at an elevated temperature. In an embodiment, the annealing operation is performed between about 750 degrees Celsius and about 900 degrees Celsius and between about 400 degrees Celsius and about 800 degrees Celsius in other embodiments. The annealing may have a duration of between 10 ms and about 80 ms. The first treatment 240 as an annealing operation may be used to enhance the material property of the gate dielectric layer 220. In an embodiment, the first treatment 240 is an etching operation in which a portion of the semiconductor device 100 is etched. In an embodiment, the first treatment 240 is a cleaning step. In conditions where the first treatment 240 as an etching or cleaning operation, the materials underlying the first barrier layer 222, such as the gate dielectric layer 220, may be protected from adverse impact due to the first treatment 240. In an embodiment, the first barrier layer 222 is regarded as an etch stop layer for the first treatment 240. In an embodiment, an etch selectivity between the first barrier layer 222 and the gate dielectric layer 220 is greater than about 10, or greater than about 5 in other embodiments.

A second barrier layer 224 is deposited over the first barrier layer 222 and the gate dielectric layer 220, as illustrated in FIG. 1J. The second barrier layer 224 comprises a material selected from a group of TiN, TiCN, TaN, TaCN, WN, WCN, TaSiN and TiSiN. In an embodiment, the second barrier layer 224 has a multilayer or a stacked structure. In an embodiment, the second barrier layer 224 is conformally deposited on sidewalls and the bottom of the first trench 209A and the second trench 209B. The second barrier layer 224 may be formed using PVD, CVD or other suitable deposition methods. The second barrier layer 224 serves various functions for the MG electrode of the semiconductor device 100 similar to the first barrier layer 222. For example. the second barrier layer 224 may be used as a diffusion barrier layer that prevents metallic atoms in the overlying layers from diffusing into underlying features. Moreover, the configuration of the second barrier layer 224, such as its profile and thickness, may affect the threshold voltage of the finalized semiconductor device 100. In an embodiment, the second barrier layer 224 is adopted as a protection layer of the underlying layers such that the underlying features will not be adversely affected by some treatments. In an embodiment, the first barrier layer 222 and the second barrier layer 224 have different material compositions materials and/or thicknesses.

Referring to FIG. 1K, a second treatment 250 is performed. In an embodiment, the second treatment 250 is an annealing operation in which the substrate 202 or the layers/features of the semiconductor device 100 other than the substrate 202 are processed at an elevated temperature. In an embodiment, the annealing operation is performed between about 750 degrees Celsius and about 900 degrees Celsius and between about 400 degrees Celsius and about 800 degrees Celsius in other embodiments. In an embodiment, the annealing operation is performed between about 800 degrees Celsius and about 950 degrees Celsius. The annealing may have a duration of between 10 ms and about 80 ms. The second treatment 250 as an annealing operation may be used to enhance the material properties of the gate dielectric layer 220. The annealing operation may be used to enhance the material properties of the gate dielectric layer 220 or other portions of the structures of FIG. 1K. In an embodiment, the second treatment 250 is an etching operation in which a portion of the semiconductor device 100 is etched. In an embodiment, the second treatment 250 is a cleaning step. In conditions where the second treatment 250 as an etching or cleaning operation, the materials underlying the second barrier layer 224, such as the gate dielectric layer 220, may be protected from damage due to the second treatment 250. In an embodiment, the second barrier layer 224 is regarded as an etch stop layer for the second treatment 250. In an embodiment, an etch selectivity between the second barrier layer 224 and the gate dielectric layer 220 is greater than about 10, or greater than about 5 in other embodiments.

FIG. 1L shows deposition of a work function layer 225 over the second barrier layer 224. The work function layer 225 is conformally formed over the horizontal surface of the second barrier layer and into the trenches 209A and 209B. In an embodiment, the work function layer 225 for the first P-type FET device 262A may include one or more layer comprised of materials such as TiN, W, Ta, Ni, Pt, Ru, Mo, Al, WN, combinations thereof, or the like. In alternative embodiment, the work function layer 225 for the second N-type FET device 262B may include one or more layer comprised of materials such as Ti, Ag, Al, TiAlMo, Ta, TaN, TiAlC, TiAlN, TaC, TaCN, TiAl, TaSiN, Mn, Zr, combinations thereof, or the like. In some embodiments, the work function layer 225 can be present in both the first P-type FET device 262A and the second N-type-FET device 262B, although the layer thicknesses in different types of FET devices may be various. The work function layer 225 may be formed using PVD, CVD, ALD, or other suitable deposition methods.

FIG. 1M to FIG. 1Q show different schemes of selective etching operations on the work function layer 225, the first barrier layer 222 and the second barrier layer 224. In an embodiment shown in FIG. 1M, a thickness of the work function layer 225 is removed from the second N-type FET device 262B through the selective etching operation. Meanwhile, the work function layer 225, the first barrier layer 222 and second barrier layer 224 around the first trench 209A of the first P-type FET device 262A is kept intact. An exemplary selective etching operation may include providing a patterned photoresist layer (not shown) or mask layer to expose the second trench 209B, while keeping the first trench 209A covered. An etching step is subsequently performed to remove the portions of the work function layer 225 with the patterned photoresist as etching mask. The selective etching operation may be performed by a wet etch, a dry etch or a combination thereof. For example, an etchant comprising at least one of HCl, $NH_4OH$, $H_2SO_4$ and $H_2O_2$ may be used in a wet etch operation. The etchant comprises $H_2O_2$ and HCl in some embodiments, comprises $NH_4OH$ and $H_2O_2$ in some other embodiments, and comprises $H_2SO_4$ and $H_2O_2$ in still some other embodiments. In an embodiment, the Cl-based gas may be used in a dry etch operation. The duration for the dry etch operation may be between about 20 seconds and about 80 seconds. The photoresist or mask layer may be stripped after the etching operation. In an embodiment, the removed thickness of the work function layer 225 can be controlled, e.g., through different etching time, such that only a certain thickness of the work function layer 225 is removed according to design requirement. In some embodiments, the etching operation removes the work function layer 225 outside of the trench 209B while leaving a remaining portion 225R of the work function layer 225 with a predetermined thickness within the trench 209B.

FIG. 1N shows another embodiment of the etching operation on another second N-type FET device 262C in which the work function layer 225 is entirely removed. A respective trench 209C for the second FET device 262C is also shown in FIG. 1N. The second barrier layer 224 around the second FET device 262C is exposed due to the etching operation accordingly. Meanwhile, the work function layer 225, the first barrier layer 222 and second barrier layer 224 around the first trench 209A of the first P-type FET device 262A is kept intact.

FIG. 1O shows a further embodiment of the etching operation on another second N-type FET device 262D in which the work function layer 225 and a thickness of the second barrier layer 224 are etched, leaving a residual second barrier layer 224R. A respective trench 209D for the second FET device 262D is also shown in FIG. 1O. The second barrier layer 224 around the second FET device 262D still covers the first barrier layer 222. Meanwhile, the work function layer 225, the first barrier layer 222 and second barrier layer 224 around the first trench 209A of the first P-type FET device 262A is kept intact. In some embodiments, the etching operation removes the work function layer 225 and the second barrier layer 224 outside of the trench 209D while only leaving a thickness of the second barrier layer 224 within the trench 209D.

FIG. 1P shows yet another embodiment of the etching operation on another second N-type FET device 262E in which the work function layer 225 and the second barrier layer 224 are entirely removed while a thickness of the first barrier layer 222 is also etched. A respective trench 209E for the second FET device 262E is also shown in FIG. 1P. The first barrier layer 222 around the second FET device 262E is exposed due to the etching operation accordingly. Meanwhile, the work function layer 225, the first barrier layer 222 and second barrier layer 224 around the first trench 209A of the first P-type FET device 262A is kept intact.

FIG. 1Q shows yet another embodiment of the etching operation on another second N-type FET device 262F in which the work function layer 225, the second barrier layer 224 and the first barrier layer 222 are entirely removed. A respective trench 209F for the second FET device 262E is also shown in FIG. 1Q. The gate dielectric layer 220 for the second FET device 262E is exposed accordingly. In some embodiment, only a thickness of the first barrier layer 222 is etched and thus the gate dielectric layer 220 is covered by the thinned first barrier layer 222. In some embodiments, the etching operation removes the first barrier layer 222 outside of the trench 209E while only leaving a thickness of the first barrier layer 222 within the trench 209E. Meanwhile, the work function layer 225, the first barrier layer 222 and second barrier layer 224 around the first trench 209A of the first P-type FET device 262A is kept intact.

In an embodiment, two or more of the various second N-type FET devices 262B through 262F shown in FIG. 1M through 1Q may be present simultaneously in the semiconductor device 100 together with the first P-type FET device 262A. The etching operation illustrated in FIG. 1M through FIG. 1Q may be performed by a single etching step that remove one or more of the work function layer 225, the first barrier layer and the second barrier layer 224 with a same etchant. Alternatively, multiple etching steps may be performed to etch the work function layer 225, the first barrier layer and the second barrier layer 224 using different etching methods, different etchant gas or recipes, or using different etching chambers.

The different etching arrangements on the work function layer 225, the first barrier layer 222 and second barrier layer 224 in the trenches 209A and 209B through 209F enable different voltage thresholds in various MG electrodes of MOSFET devices, particularly NMOS transistor devices, in the substrate 202. Through the etching operation for obtaining thinned or removed composite structures by controlling the thicknesses of the work function layer 225, the first barrier layer 222 and the second barrier layer 224, the threshold voltage of the FET devices 262B through 262F can be made different from each other. Especially, a relatively low threshold voltage can be achieved for a FET device, e.g., device 209F, through removing the barrier layers. The FET devices thus manufactured can thus benefit a high-speed performance of a semiconductor device.

Referring to FIG. 1R, a work function layer 226 is selectively deposited over the gate dielectric layer 220 of the second FET device 209F. An exemplary semiconductor device 100 including the FET devices 262A and 262F are shown in FIG. 1R. Therefore, the work function layer 226 is directly formed on the gate dielectric layer 220. Additionally, the work function layer 226 may be formed on the topmost layer of the work function layer 225, the first barrier layer 222 and the second barrier layer 224 if these layers are retained in the respective trenches. In some embodiments, the work function layer 226 is also formed on the work function layer 225 of the first P-type FET device 262A. The work function layer 226 may be formed of one or more layers and may comprise materials selected from a group of TiN, TaN, WN, Ti, Ag, Al, TiAlMo, Ta, TiAlC, TiAlN, TaC, TaCN, TiAl, TaSiN, Mn, Zr, combinations thereof, or the like. In the present embodiment, the work function layer 226 comprises Al or AlTi for an N-type FET device. In an embodiment, an atomic ratio of the Al to Ti in the work function layer 226 is between about 1 and 5.

An adhesive layer 228 is subsequently formed once the work function layer 226 is deposited. The adhesive layer 228 is formed over the surface of the work function layers 225 and 226 and into the trenches 209A and 209F. The adhesive layer 228 may include Ti, TiN, Ta, TaN or combinations thereof. The work function layer 226 and the adhesive layer 228 may be formed using the PVD, CVD, sputtering, plating or other suitable methods.

A conductive layer 230 is deposited over the adhesive layer 228, as illustrated in FIG. 1S. The conductive layer 230 also fills the spaces in the trenches 209A and 209F surrounded by the adhesive layer 228. In an embodiment, the conductive layer 230 may include copper, cobalt, aluminum, tungsten, or other suitable materials. The conductive layer 230 may be deposited using CVD, PVD, plating, or other suitable process. Since the trench 209F of the second FET device 262F has a less thickness of the barrier layer 222 and 224 and the work function layer 225 than the trench 209A of the first FET device 262A, a greater filling capability of the trench 209F can be achieved.

Referring to FIG. 1T, after the trenches 209A and 209F are filled with the conductive layer 230, a planarization operation (e.g., a CMP or mechanical grinding operation) is performed to level the gate dielectric layer 220, the first barrier layer 222, the second barrier layer 224, the work function layers 225 and 226, the adhesive layer 228 and the conductive layer 230. In an embodiment, an upper surface of the ILD layer 218 is exposed through the planarization operation. As a result, the first metal gate stack 260A and a second metal gate stack 260F are formed such that the first metal gate stack 260A for the P-type FET device 262A comprises the dielectric layer 206, the gate dielectric layer 220, the first barrier layer 222, the second barrier layer 224, the work function layers 225 and 226, the adhesive layer 228 and the conductive layer 230, while the second metal gate stack 260F for the N-type FET device 262F comprises the dielectric layer 206, the gate dielectric layer 220, the work function layer 226, the adhesive layer 228 and the conductive layer 230. In alternative embodiments, other second metal gate stack, such as those formed through the etching operations in one of FIGS. 1M through 1Q, includes one or more of the first barrier layer 222, the second barrier layer 224 and the word function layer 225.

The conductive layer 230 in the second metal gate stack 260F has a width greater than the width of the conductive layer 230 in the first metal gate stack 260A. That means a good MG filling capability is obtained in the second metal gate stack 260B due to the removal of the first barrier layer 222 and/or the second barrier layer 224 prior to the filling of the conductive layer 230. Moreover, the metal gate resistance of the second metal gate stack 260F is lower than the metal gate resistance of the first metal gate stack 260A due to a greater conduction area from a top-view perspective. In some embodiments, the resultant threshold voltage of the first metal gate stack 260A is greater than the threshold voltage of the second metal gate stack 260B due to lower amount of filled metal and a higher resistance. In an embodiment, subsequent processes, including interconnect processing, are performed after forming the metal gate stacks 260A and 260B.

Figure 2:
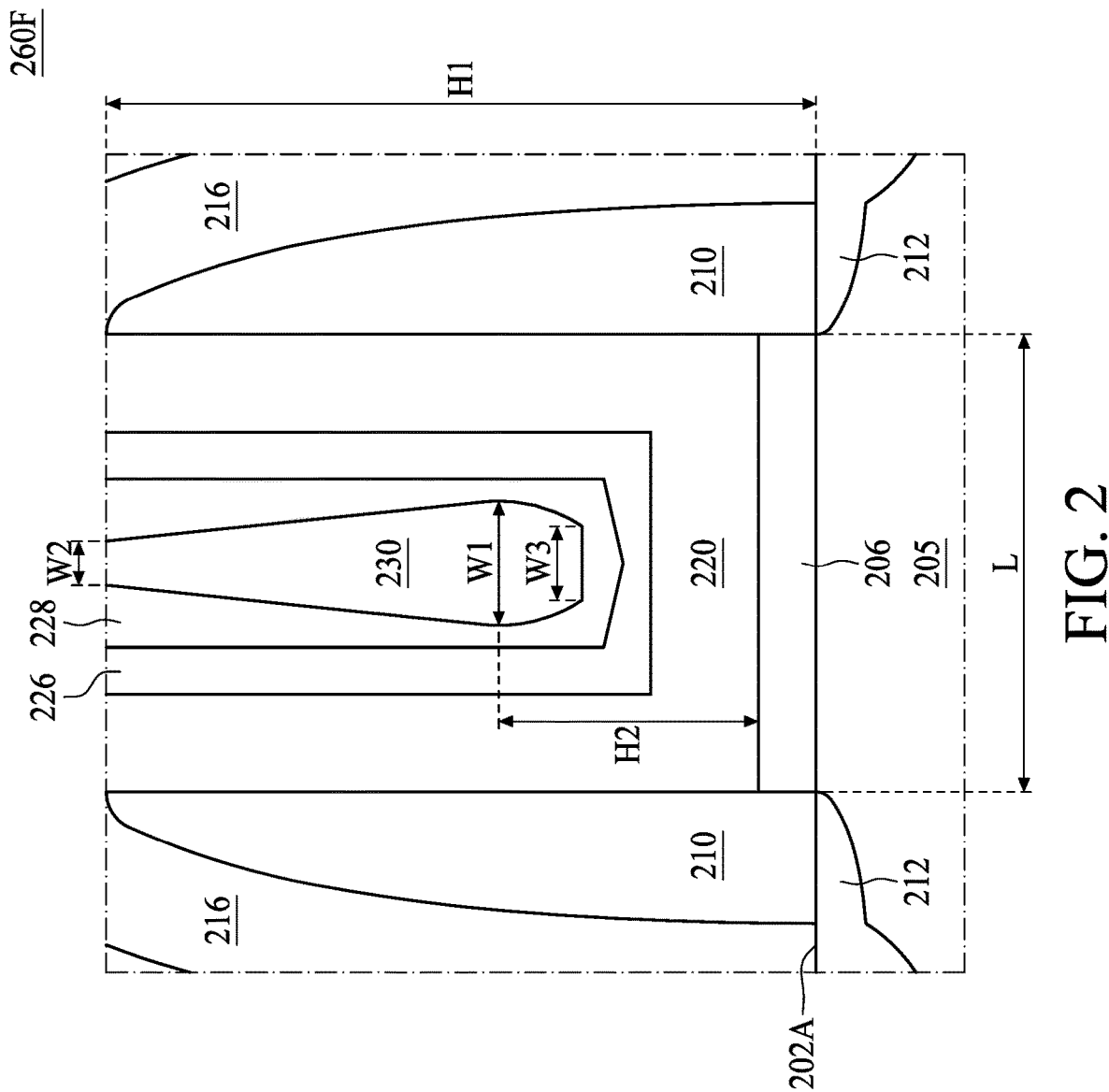
FIG. 2 is an enlarged schematic cross-sectional diagram of a gate stack of a semiconductor device, in accordance with some embodiments.

As described previously, the problem of the filling capability of the conductive layer in the metal gate stack is addressed through the selective etching of the barrier layers 222 and/or 224. The filling capability can be roughly indicated by the area from a top-view perspective or the width from a cross-sectional view of the conductive layer 230. FIG. 2 shows an enlarged schematic cross-sectional diagram of the second metal gate stack 260F of the semiconductor device 100, in accordance with some embodiments. In an embodiment, a height H1 of the second metal gate stack 260F (or equivalently the height summation of the gate dielectric layer 220 and the dielectric layer 206), measured from a surface 202A of the substrate 202, is between about 10 nm and about 30 nm. In an embodiment, a width L of the second trench 209F (see FIG. 1Q), or substantially the length L of the channel region for the FET device 262F, is between about 6 nm and about 240 nm. The conductive layer 230 includes a top surface having a width W2 and a bottom surface having a width W3. Since the barrier layers 222 and 224 are removed from the second metal gate stack 260F, a greater space is left for the filling of the conductive layer 230. In an embodiment, the sidewall of the adhesive layer 228 may include a greater thickness around its top surface than in the middle or the bottom portion due to an overhang effect. Therefore, the bottom width W3 of the conductive layer 230 may be greater than the top width W2. In an embodiment, the conductive layer 230 has a maximal width W1 around the bottom surface of the conductive layer 230. In an embodiment, the maximal width W1 is between about 1 nm and about 10 nm. In an embodiment, the width W2 is equal to or less than about 5 nm and greater than zero nm. In an embodiment, a ratio between the width W2 and the maximal width W1 is equal to or less than about 30% and greater than 0%. In an embodiment, the maximal width W1 is at a height H2, measured from the surface 202A, between about 3 nm and about 10 nm. In an embodiment, a ratio between the height H2 and the height H1 is between about 10% and about 30%.

Figure 3:
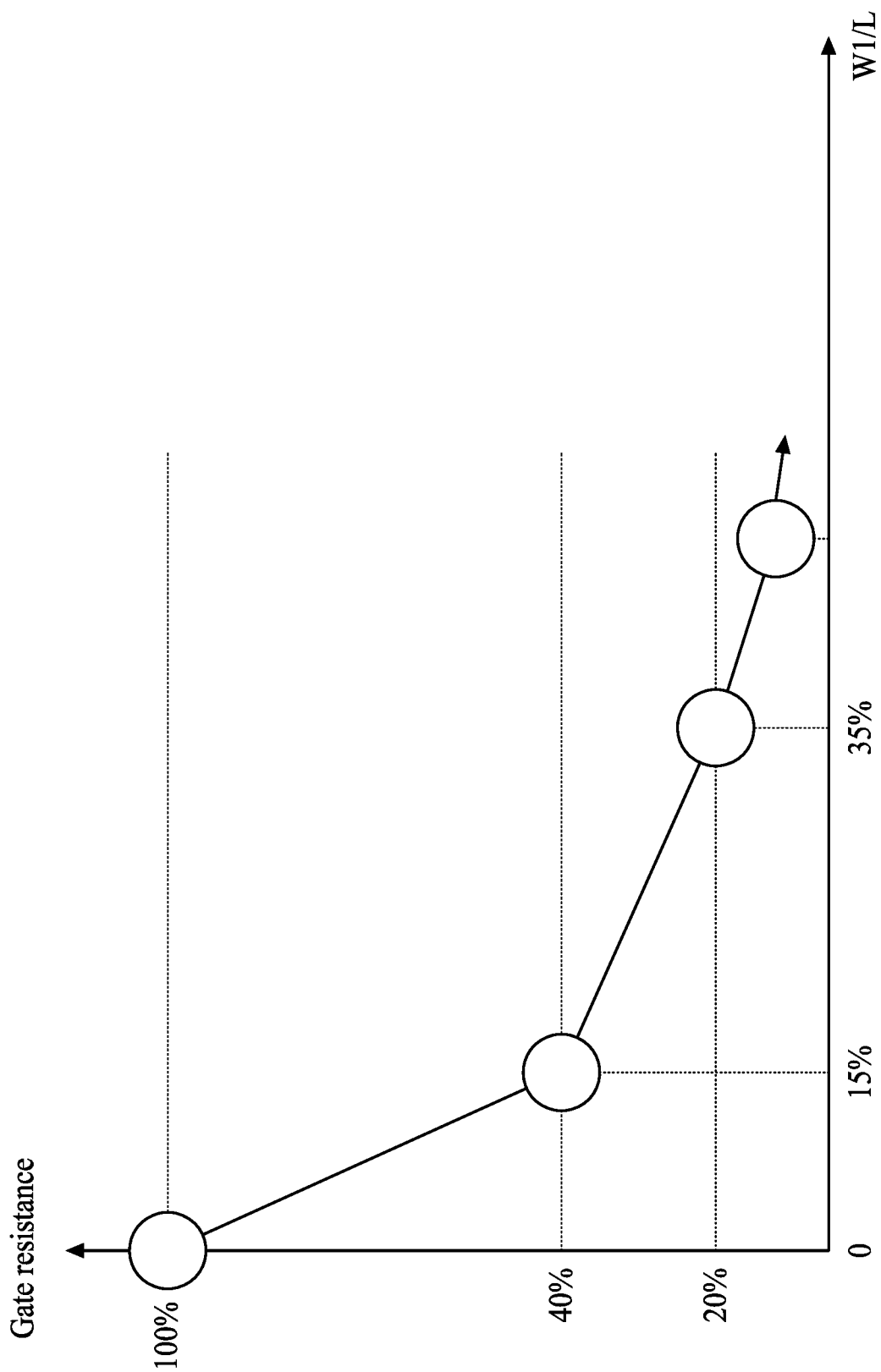
FIG. 3 is a schematic diagram showing a device performance with respect to a gate filling ratio, in accordance with some embodiments.

FIG. 3 is a schematic diagram showing a device performance of the second metal gate stack 260F with respect to the gate filling capability, in accordance with some embodiments. The graph illustrates a simulation result of the gate resistance values with respect to different widths of the conductive layer 230. As discussed previously, a greater area or width of the conductive layer 230 corresponds to better conduction performance provided by the conductive layer 230. As a result, a greater width of the conductive layer 230 may lead to a reduced gate resistance of the metal gate stack 230B. As shown in the graph of FIG. 3, the x-axis represents a ratio between the maximal width W1 and the channel length L, and the y-axis represents the gate resistance values normalized to a reference gate resistance in which the maximal width W1 is approximately zero. The simulation result reveals that, when the ratio of W1/L is increased to about 15%, the normalized gate resistance is reduced dramatically to 40% of its highest value. Moreover, the normalized gate resistance is reduced to 20% when the ratio of W1/L increases to about 35%. From the foregoing, it is clear that the expanded width W1 can effectively reduce the resistance of the metal gate. Device advantages, such as a lower threshold voltage or a greater device speed of the semiconductor device 100, can also be expected.

According to an embodiment, a method of forming a semiconductor structure includes: providing a substrate; forming a first pair of source/drain regions in the substrate; disposing an interlayer dielectric layer over the substrate, the interlayer dielectric layer having a first trench between the first pair of source/drain regions; depositing a dielectric layer in the first trench; depositing a barrier layer over the dielectric layer; removing the barrier layer from the first trench to expose the dielectric layer; depositing a work function layer over the dielectric layer in the first trench; and depositing a conductive layer over the work function layer in the first trench.

According to an embodiment, a method of forming a semiconductor structure includes: forming a first pair of source/drain regions and a second pair of source/drain regions in a substrate; depositing an interlayer dielectric layer over the substrate, the interlayer dielectric layer having a first trench between the first pair of source/drain regions and a second trench between the second pair of source/drain regions; depositing a gate dielectric layer in the first trench and the second trench, respectively; depositing a work function layer in the first trench and the second trench; depositing a barrier stack over the gate dielectric layer in the first trench and the second trench; reducing a thickness of the barrier stack from the first trench while keeping the barrier stack intact in the second trench; and depositing a conductive layer in the first trench and the second trench over the work function layer.

According to an embodiment, a semiconductor structure includes a substrate and a first pair of source/drain regions and a second pair of source/drain regions in the substrate. The semiconductor structure also includes a first gate stack and a second gate stack over the substrate between the first pair and the second pair of source/drain regions, respectively. Each gate stack includes a gate dielectric layer over the substrate, a work function layer surrounded by the gate dielectric layer, and a conductive layer surrounded by the work function layer. The first gate stack further includes a barrier layer, that is absent from the second gate stack, between the gate dielectric layer and the work function layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure, comprising:
   providing a substrate;
   forming a first pair of source/drain regions in the substrate;
   disposing an interlayer dielectric layer over the substrate, the interlayer dielectric layer having a first trench between the first pair of source/drain regions;
   depositing a dielectric layer in the first trench;
   depositing a barrier layer over the dielectric layer;
   removing the barrier layer from the first trench to expose the dielectric layer;
   depositing a work function layer over the dielectric layer in the first trench; and
   depositing a conductive layer over the work function layer in the first trench.

2. The method according to claim 1, further comprising:
forming a second pair of source/drain regions having a first dopant type in the substrate; and
forming a second trench in the interlayer dielectric layer between the second pair of source/drain regions,
wherein depositing a barrier layer over the dielectric layer comprises depositing the barrier layer in the second trench.

3. The method according to claim 2, wherein removing the barrier layer from the first trench comprises keeping the barrier layer intact in the second trench.

4. The method according to claim 1, wherein depositing a barrier layer over the dielectric layer comprises depositing the barrier layer on a sidewall of the dielectric layer.

5. The method according to claim 1, further comprising forming an adhesive layer in the first trench over the work function layer prior to depositing the conductive layer in the first trench.

6. The method according to claim 1, wherein depositing an interlayer dielectric layer having a first trench between the first pair of source/drain regions comprises:
forming a dummy gate structure over the substrate;
depositing the interlayer dielectric layer to surround the dummy gate structure; and
removing the dummy gate structure to form the first trench.

7. The method according to claim 6, further comprising forming a spacer on a sidewall of the dummy gate structure, wherein removing the dummy gate structure to form the first trench comprises leaving the spacer to define the first trench.

8. The method according to claim 1, further comprising:
depositing a second barrier layer prior to depositing the work function layer;
performing an annealing operation; and
partially removing the second barrier layer subsequent to the annealing operation.

9. The method according to claim 1, wherein the conductive layer comprises a top surface having a first width and a bottom surface having a second width greater than the first width.

10. The method according to claim 1, wherein the conductive layer comprises a top surface having a first width, and a ratio between the first width and a maximal width of the conductive layer is less than about 30%.

11. The method according to claim 1, wherein the conductive layer comprises a maximal width, at a height measured from a surface of the substrate, between about 10% and about 30% of a height of the dielectric layer.

12. A method of forming a semiconductor structure, comprising:
forming a first pair of source/drain regions and a second pair of source/drain regions in a substrate;
depositing an interlayer dielectric layer over the substrate, the interlayer dielectric layer having a first trench between the first pair of source/drain regions and a second trench between the second pair of source/drain regions;
depositing a gate dielectric layer in the first trench and the second trench, respectively;
depositing a barrier stack over the gate dielectric layer in the first trench and the second trench;
depositing a work function layer in the first trench and the second trench;
reducing a thickness of the barrier stack from the first trench while keeping the barrier stack intact in the second trench; and
depositing a conductive layer in the first trench and the second trench over the work function layer.

13. The method according to claim 12, further comprising performing an annealing operation on the semiconductor structure prior to reducing a thickness of the barrier stack from the first trench.

14. The method according to claim 12, further comprising performing a cleaning operation on the substrate prior to reducing a thickness of the barrier stack from the first trench.

15. The method according to claim 12, wherein reducing a thickness of the barrier stack from the first trench comprises removing the barrier stack from the first trench to expose the gate dielectric layer.

16. The method according to claim 12, wherein the barrier stack comprises at least one of titanium nitride, titanium silicon nitride and tantalum nitride.

17. The method according to claim 12, wherein the reducing a thickness of the barrier stack from the first trench comprises performing a wet etching operation.

18. A method of forming a semiconductor structure, comprising:
forming a first dummy gate electrode and a second dummy gate electrode over a substrate;
forming in the substrate a first pair of source/drain regions between the first dummy gate electrode and a second pair of source/drain regions between the second dummy gate electrode;
depositing an interlayer dielectric layer over the first and second dummy gate electrodes and the substrate;
etching the first and second dummy gate electrodes to form a first trench between the first pair of source/drain regions and a second trench between the second pair of source/drain regions;
depositing a gate dielectric layer in the first trench and the second trench, respectively;
depositing a barrier stack over the gate dielectric layer in the first trench and the second trench;
depositing a first work function layer in the first trench and the second trench;
removing the first work function layer and the barrier stack from the first trench while keeping the first work function layer and the barrier stack intact in the second trench;
depositing a second work function layer in the first trench and the second trench; and
depositing a conductive layer over the second work function layer in the first trench and the second trench.

19. The method according to claim 18, further comprising performing a first annealing operation subsequent to depositing the barrier stack and prior to depositing the first work function layer.

20. The method according to claim 18, further comprising performing a second annealing operation subsequent to depositing the gate dielectric layer and prior to depositing the barrier stack.

* * * * *